(12) United States Patent
Lee et al.

(10) Patent No.: US 12,309,305 B2
(45) Date of Patent: May 20, 2025

(54) ELECTRONIC DEVICE INCLUDING WATERPROOF STRUCTURE

(71) Applicant: Samsung Electronics Co., Ltd., Suwon-si (KR)

(72) Inventors: Hyungwoo Lee, Suwon-si (KR); Sungho Lee, Suwon-si (KR); Namjun Kim, Suwon-si (KR); Jaekook Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 468 days.

(21) Appl. No.: 17/572,165

(22) Filed: Jan. 10, 2022

(65) Prior Publication Data
US 2022/0224783 A1    Jul. 14, 2022

Related U.S. Application Data

(63) Continuation of application No. PCT/KR2021/018897, filed on Dec. 13, 2021.

(30) Foreign Application Priority Data

Jan. 11, 2021   (KR) .................. 10-2021-0003527
Apr. 2, 2021    (KR) .................. 10-2021-0043604

(51) Int. Cl.
*H04M 1/02* (2006.01)
*H05K 5/02* (2006.01)

(52) U.S. Cl.
CPC ........ *H04M 1/0202* (2013.01); *H05K 5/0213* (2013.01)

(58) Field of Classification Search
CPC ..... H04M 1/0202; H04M 1/18; H05K 5/0213
(Continued)

(56) References Cited

U.S. PATENT DOCUMENTS 10,356,502 B2    7/2019  Nakamura et al.
10,820,094 B2    10/2020 Park et al.
(Continued)

FOREIGN PATENT DOCUMENTS

JP    2009-010234 A    1/2009
JP    2014-175366 A    9/2014
(Continued)

OTHER PUBLICATIONS

International Search Report dated Mar. 25, 2022, issued in International Patent Application No. PCT/KR2021/018897.

*Primary Examiner* — Eugene Yun
(74) *Attorney, Agent, or Firm* — Jefferson IP Law, LLP

(57) ABSTRACT

An electronic device is provided. The electronic device includes a front plate, a back plate that faces the front plate, a side member that surrounds an inner space between the front plate and the back plate and includes a frame that forms a side surface of the electronic device and a plate that extends from the frame toward the inner space, and a blocking member located in the inner space and disposed on the plate to cover a partial area of the plate connected with the outside of the electronic device. The blocking member includes a membrane and a cover member that is disposed between the membrane and the plate and that has a through-hole formed in at least a portion thereof. The through-hole fluidly communicates with the outside of the electronic device through the partial area of the plate.

17 Claims, 21 Drawing Sheets

(58) Field of Classification Search
USPC .................................................. 455/575.8
See application file for complete search history.

(56) References Cited

U.S. PATENT DOCUMENTS

| | | | |
|---|---|---|---|
| 11,228,832 B2 | 1/2022 | Sim et al. | |
| 2017/0251291 A1 | 8/2017 | Nakamura et al. | |
| 2018/0035204 A1 | 2/2018 | Park et al. | |
| 2020/0329303 A1 | 10/2020 | Sim et al. | |
| 2023/0261684 A1* | 8/2023 | Wu | H04M 1/03 361/679.01 |

FOREIGN PATENT DOCUMENTS

| | | | |
|---|---|---|---|
| JP | 2014-220635 A | 11/2014 |
| JP | 2017-152945 A | 8/2017 |
| JP | 2020-010239 A | 1/2020 |
| KR | 20-0252884 Y1 | 10/2001 |
| KR | 10-2002-0088702 A | 11/2002 |
| KR | 10-2018-0013613 A | 2/2018 |
| KR | 10-2020-0119105 A | 10/2020 |

\* cited by examiner

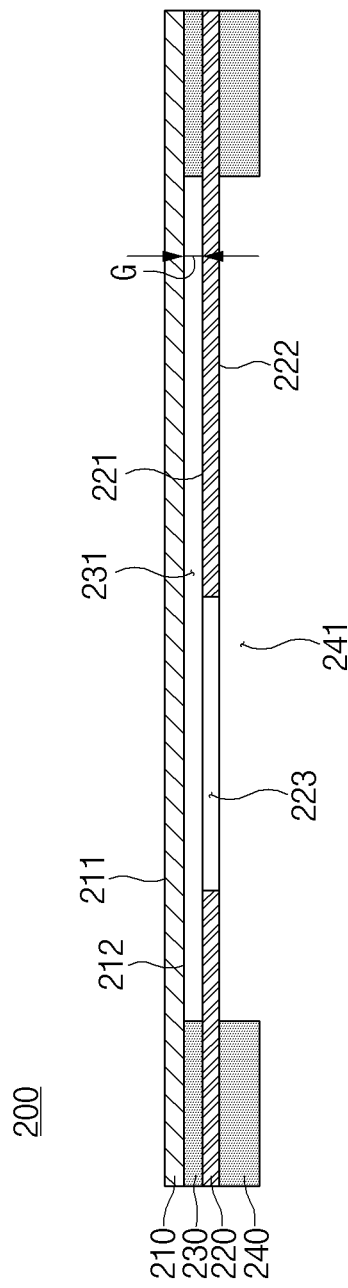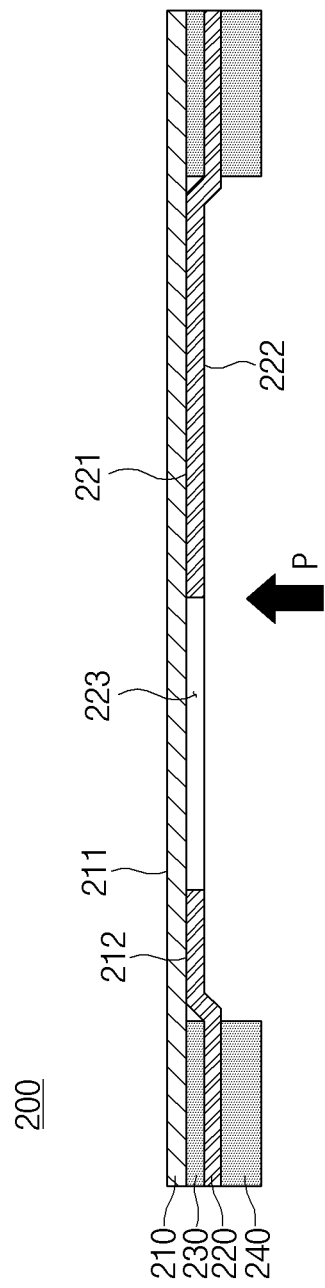

ELECTRONIC DEVICE INCLUDING WATERPROOF STRUCTURE

CROSS-REFERENCE TO RELATED APPLICATION(S)

This application is a continuation application, claiming priority under § 365(c), of an International application No. PCT/KR2021/018897, filed on Dec. 13, 2021, which is based on and claims the benefit of a Korean patent application number 10-2021-0003527, filed on Jan. 11, 2021, in the Korean Intellectual Property Office, and of a Korean patent application number 10-2021-0043604, filed on Apr. 2, 2021, in the Korean Intellectual Property Office the disclosure of which is incorporated by reference herein in its entirety.

TECHNICAL FIELD

The disclosure relates to an electronic device including a waterproof structure.

BACKGROUND ART

An electronic device may include at least one vent hole for allowing air pressure inside the electronic device and air pressure outside the electronic device to remain the same. For example, air may flow through the vent hole so that the air pressure inside the electronic device and the air pressure outside the electronic device may remain substantially the same. Accordingly, low performance and/or malfunctions of various electronic components due to an air-pressure difference may be reduced. In addition, the electronic device may include a waterproof structure to prevent introduction of liquid into the electronic device through the vent hole.

The above information is presented as background information only to assist with an understanding of the disclosure. No determination has been made, and no assertion is made, as to whether any of the above might be applicable as prior art with regard to the disclosure.

DISCLOSURE

Technical Problem

The electronic device may be configured such that air flows between the inside of the housing and the outside of the housing through the vent hole exposed outside the housing, and the waterproof structure may be provided on one side of the vent hole. Liquid outside the electronic device may be introduced into the vent hole. In this case, the pressure of the liquid delivered to the waterproof structure may be reduced when the path of the vent hole is formed to be long and complicated. However, when the formation of the long and complicated path of the vent hole is restricted due to a limitation in design, the pressure of the liquid delivered to the waterproof structure may be high. Therefore, the liquid may pass through the waterproof structure, and thus a waterproof function may be deteriorated.

Aspects of the disclosure are to address at least the above-mentioned problems and/or disadvantages and to provide at least the advantages described below. Accordingly, an aspect of the disclosure is to provide an electronic device including a waterproof structure for reducing the pressure of liquid introduced through a vent hole.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a front plate, a back plate that faces the front plate, a side member that surrounds an inner space between the front plate and the back plate and includes a frame that forms a side surface of the electronic device and a plate that extends from the frame toward the inner space, and a blocking member located in the inner space and disposed on the plate to cover a partial area of the plate connected with the outside of the electronic device. The blocking member includes a membrane including a first surface and a second surface that faces away from the first surface and a cover member that is disposed between the second surface of the membrane and the plate and that has a through-hole formed in at least a portion thereof. The through-hole fluidly communicates with the outside of the electronic device through the partial area of the plate.

In accordance with another aspect of the disclosure, a blocking member is provided. The blocking member includes a membrane including a first surface and a second surface that faces away from the first surface, a cover member that is attached to the second surface of the membrane and that has a through-hole formed in at least a portion thereof, the cover member including a third surface that faces the second surface and a fourth surface that faces away from the third surface, and a first adhesive member that is disposed between the second surface and the third surface and that attaches the membrane and the cover member to each other, the first adhesive member having a first opening, at least a portion of which overlaps the through-hole. The membrane is formed of an air-permeable material, and the cover member is formed of a non-breathable material.

Advantageous Effects

The electronic device according to the various embodiments of the disclosure may reduce the pressure of liquid delivered to the membrane of the waterproof structure, thereby providing stable waterproofing performance.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which:

FIG. 9A illustrates a waterproof structure of an electronic device according to an embodiment of the disclosure;

FIG. 9B illustrates a waterproof structure of an electronic device according to an embodiment of the disclosure;

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modification of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
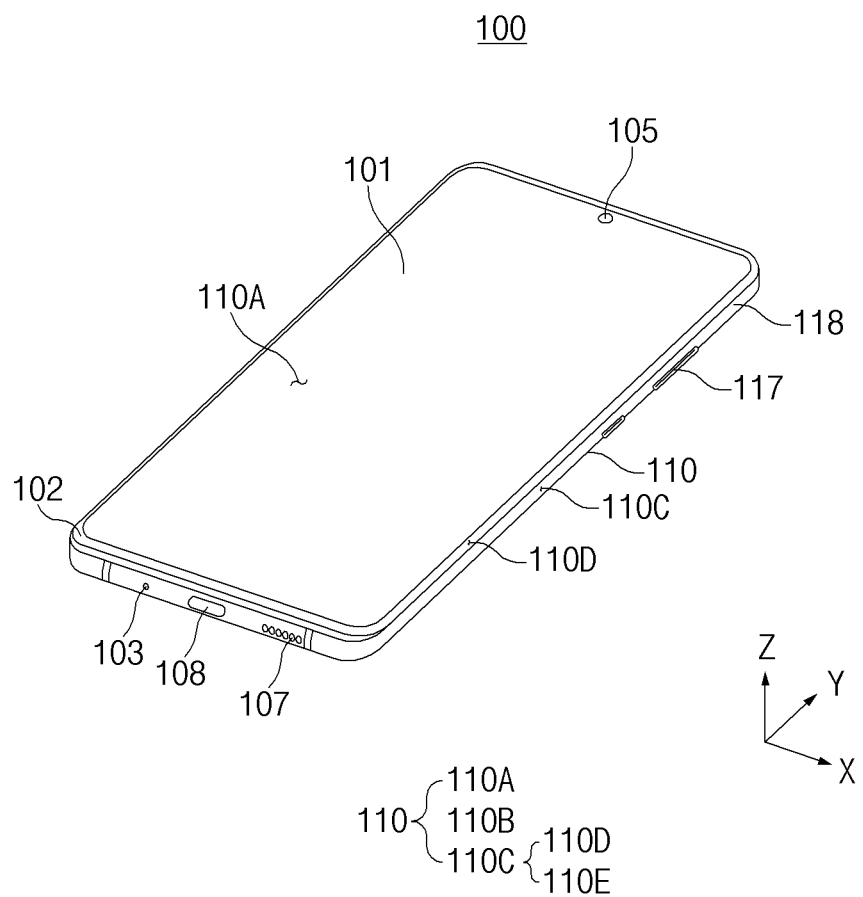
FIG. 1 is a front perspective view of an electronic device according to an embodiment of the disclosure.

FIG. 1 is a front perspective view of an electronic device according to an embodiment of the disclosure.

Figure 2:
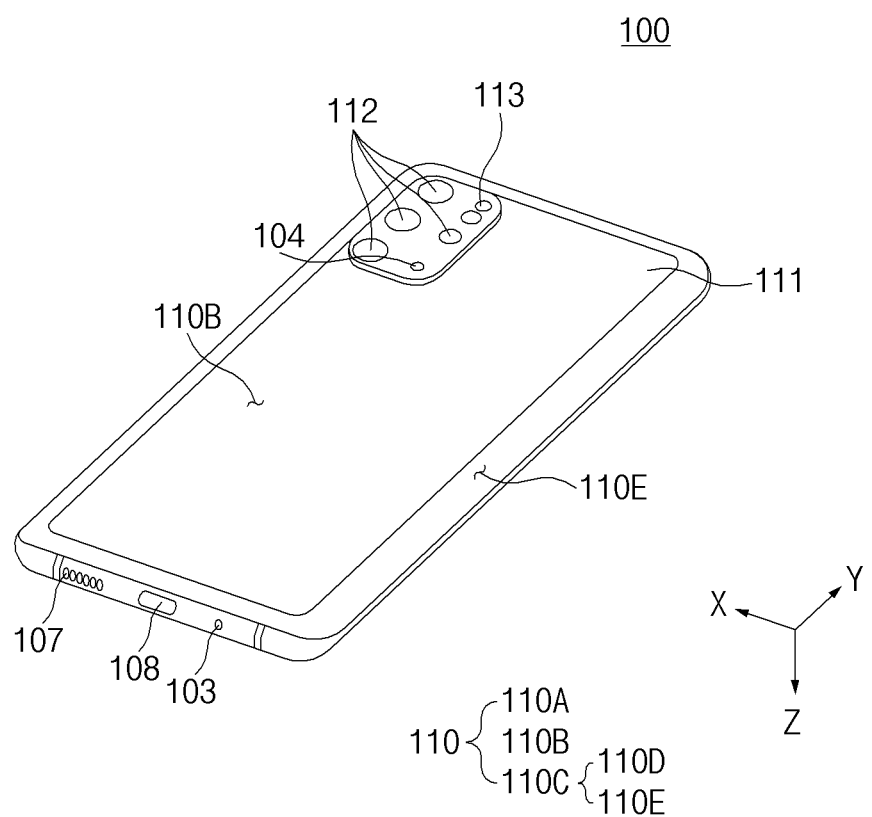
FIG. 2 is a rear perspective view of an electronic device according to an embodiment of the disclosure.

FIG. 2 is a rear perspective view of an electronic device according to an embodiment of the disclosure.

Referring to FIGS. 1 and 2, an electronic device 100 according to an embodiment may include a housing 110 that forms the exterior of the electronic device 100. For example, the housing 110 may include a first surface (or, a front surface) 110A, a second surface (or, a rear surface) 110B, and a third surface (or, a side surface) 110C that surrounds a space between the first surface 110A and the second surface 110B.

In various embodiments, the housing 110 may refer to a structure that forms some of the first surface 110A, the second surface 110B, and the third surface 110C.

In an embodiment, the first surface 110A may be formed by a front plate 102, at least a portion of which is substantially transparent (e.g., a glass plate including various coating layers, or a polymer plate). The second surface 110B may be formed by a back plate 111 that is substantially opaque. For example, the back plate 111 may be formed of coated or colored glass, ceramic, polymer, metal (e.g., aluminum, stainless steel (STS), or magnesium), or a combination of at least two thereof. The third surface 110C may be formed by a side bezel structure (or, a side member) 118 that is coupled with the front plate 102 and the back plate 111 and that contains metal and/or polymer.

In various embodiments, the back plate 111 and the side bezel structure 118 may be integrally formed with each other and may contain the same material (e.g., a metallic material such as aluminum).

In the illustrated embodiment, the front plate 102 may include two first areas 110D that curvedly and seamlessly extend from partial areas of the first surface 110A toward the back plate 111. The first areas 110D may be located at opposite long edges of the front plate 102.

In the illustrated embodiment, the back plate 111 may include two second areas 110E that curvedly and seamlessly extend from partial areas of the second surface 110B toward the front plate 102. The second areas 110E may be located at opposite long edges of the back plate 111.

In various embodiments, the front plate 102 (or, the back plate 111) may include only one of the first areas 110D (or, the second areas 110E). Furthermore, in another embodiment, the front plate 102 (or, the back plate 111) may not include a part of the first areas 110D (or, the second areas 110E).

In an embodiment, when viewed from a side of the electronic device 100, the side bezel structure 118 may have a first thickness (or, width) at sides (e.g., short sides) not including the first areas 110D or the second areas 110E and may have a second thickness at sides (e.g., long sides)

including the first areas 110D or the second areas 110E, the second thickness being smaller than the first thickness.

Figure 21:
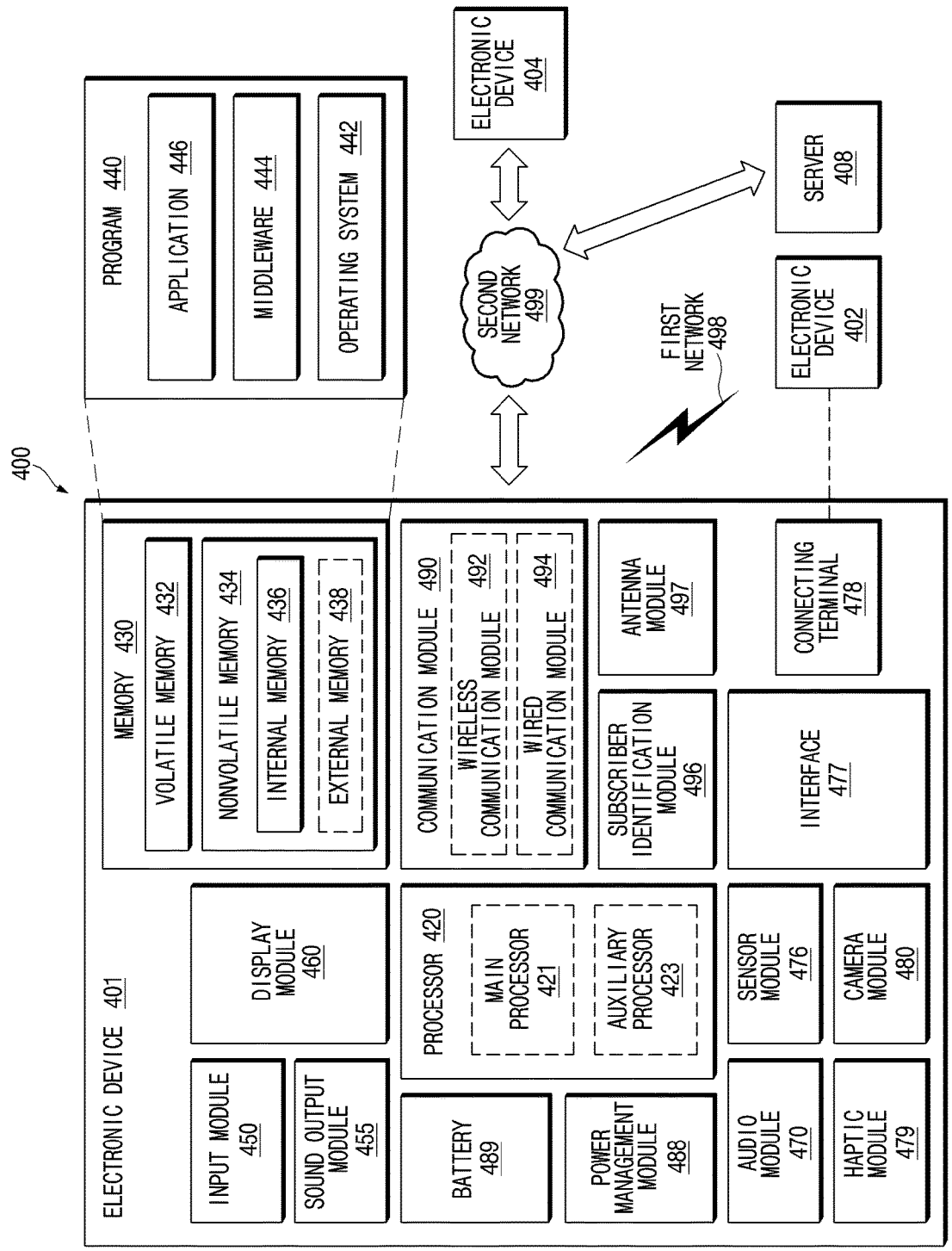
FIG. 21 is a block diagram of an electronic device in a network environment according to an embodiment of the disclosure.

In an embodiment, the electronic device 100 may include at least one of a display 101, audio modules 103, 104, and 107 (e.g., an audio module 470 of FIG. 21), a sensor module (not illustrated) (e.g., a sensor module 476 of FIG. 21), camera modules 105 112, and 113 (e.g., a camera module 480 of FIG. 21), key input devices 117 (e.g., an input device 450 of FIG. 21), a light emitting element (not illustrated), or a connector hole 108 (e.g., a connecting terminal 478 of FIG. 21). In another embodiment, the electronic device 100 may not include at least one component (e.g., the key input devices 117 or the light emitting element (not illustrated)) among the aforementioned components, or may additionally include other component(s).

In an embodiment, the display 101 may be visually exposed through most of the front plate 102. For example, at least a portion of the display 101 may be visually exposed through the front plate 102 that includes the first surface 110A and the first areas 110D of the third surface 110C. The display 101 may be disposed on the rear surface of the front plate 102.

In an embodiment, the periphery of the display 101 may be formed to be substantially the same as the shape of the adjacent outside edge of the front plate 102. In another embodiment, the gap between the outside edge of the display 101 and the outside edge of the front plate 102 may be substantially constant to expand the area by which the display 101 is visually exposed.

In an embodiment, a surface of the housing 110 (or, the front plate 102) may include a screen display area that is formed as the display 101 is visually exposed. For example, the screen display area may include the first surface 110A and the first areas 110D of the side surface.

In various embodiments, the screen display area 110A and 110D may include a sensing area (not illustrated) that is configured to obtain biometric information of a user. Here, when the screen display area 110A and 110D includes the sensing area, this may mean that at least a portion of the sensing area overlaps the screen display area 110A and 110D. For example, the sensing area may refer to an area capable of displaying visual information of the display 101 like the other areas of the screen display area 110A and 310D and additionally obtaining the user's biometric information (e.g., fingerprint).

In an embodiment, the screen display area 110A and 110D of the display 101 may include an area through which the first camera module 105 (e.g., a punch hole camera) is visually exposed. For example, at least a portion of the periphery of the area through which the first camera module 105 is visually exposed may be surrounded by the screen display area 110A and 110D. In various embodiments, the first camera module 105 may include a plurality of camera modules (e.g., the camera module 480 of FIG. 21).

In various embodiments, the display 101 may be configured such that at least one of an audio module (not illustrated), a sensor module (not illustrated), a camera module (e.g., the first camera module 305), or a light emitting element (not illustrated) is disposed on the rear surface of the screen display area 110A and 110D. For example, the electronic device 100 may be configured such that the first camera module 105 (e.g., an under display camera (UDC)) is disposed on the rear side (e.g., the side facing the −z-axis direction) of the first surface 110A (e.g., the front surface) and/or the side surface 110C (e.g., at least one surface of the first areas 110D) so as to face toward the first surface 110A and/or the side surface 110C. For example, the first camera module 105 may be disposed under the display 101 and may not be visually exposed through the screen display area 110A and 110D.

In another embodiment (not illustrated), the display 101 may be coupled with, or disposed adjacent to, touch detection circuitry, a pressure sensor capable of measuring the intensity (pressure) of a touch, and/or a digitizer for detecting a stylus pen of a magnetic field type.

In an embodiment, the audio modules 103, 104, and 107 may include the microphone holes 103 and 104 and the (external) speaker hole 107.

In an embodiment, the microphone holes 103 and 104 may include the first microphone hole 103 formed in a partial area of the third surface 110C and the second microphone hole 104 formed in a partial area of the second surface 110B. A microphone (not illustrated) for obtaining an external sound may be disposed in the microphone holes 103 and 104. The microphone may include a plurality of microphones to sense the direction of a sound.

In an embodiment, the second microphone hole 104 formed in the partial area of the second surface 110B may be disposed adjacent to the camera modules 105, 112, and 113. For example, the second microphone hole 104 may obtain sounds when the camera modules 105, 112, and 113 are executed, or may obtain sounds when other functions are executed.

In an embodiment, the speaker hole 107 may include an external speaker hole 107 and a receiver hole for telephone call (not illustrated). The external speaker hole 107 may be formed in a portion of the third surface 110C of the electronic device 100. In another embodiment, the external speaker hole 107 and the microphone hole 103 may be implemented as a single hole. Although not illustrated, the receiver hole for telephone call (not illustrated) may be formed in another portion of the third surface 110C. For example, the receiver hole for telephone call may be formed in another portion (e.g., a portion facing the +y-axis direction) of the third surface 110C that faces the portion (e.g., a portion facing the −y-axis direction) of the third surface 110C in which the external speaker hole 107 is formed. According to various embodiments, the receiver hole for telephone call may not be formed in a portion of the third surface 110C and may be formed by a separation space between the front plate 102 (or, the display 101) and the side bezel structure 118.

In an embodiment, the electronic device 100 may include at least one speaker (not illustrated) that is configured to output a sound outside the housing 110 through the external speaker hole 107 or the receiver hole for telephone call (not illustrated). According to various embodiments, the speaker may include a piezoelectric speaker not including the speaker hole 107.

In an embodiment, the sensor module (not illustrated) may generate an electrical signal or a data value that corresponds to an operational state inside the electronic device 100 or an environmental state external to the electronic device 100. For example, the sensor module may include at least one of a proximity sensor, a heart rate monitor (HRM) sensor, a fingerprint sensor, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor.

In an embodiment, the camera modules 105, 112, and 113 may include the first camera module 105 (e.g., a punch hole camera) visually exposed on the first surface 110A of the electronic device 100, the second camera module 112 visually exposed on the second surface 110B, and/or the flash 113.

In an embodiment, the first camera module 105 may be visually exposed through a portion of the screen display area 110A and 110D of the display 101. For example, the first camera module 105 may be visually exposed on a partial area of the screen display area 110A and 110D through an opening (not illustrated) that is formed in a portion of the display 101. In another example, the first camera module 105 (e.g., an under display camera) may be disposed on the rear surface of the display 101 and may not be visually exposed through the screen display area 110A and 110D.

In an embodiment, the second camera module 112 may include a plurality of cameras (e.g., a dual camera, a triple camera, or a quad camera). However, the second camera module 112 is not necessarily limited to including the plurality of cameras and may include one camera.

In an embodiment, the first camera module 105 and the second camera module 112 may include one or more lenses, an image sensor, and/or an image signal processor. The flash 113 may include, for example, a light emitting diode or a xenon lamp. In another embodiment, two or more lenses (an IR camera lens, a wide angle lens, and a telephoto lens) and image sensors may be disposed on one surface of the electronic device 100.

In an embodiment, the key input devices 117 may be disposed on the third surface 110C (e.g., the first areas 110D and/or the second areas 110E) of the housing 110. In another embodiment, the electronic device 100 may not include all or some of the key input devices 117, and the key input devices 117 not included may be implemented in a different form, such as a soft key, on the display 101. In another embodiment, the key input devices may include a sensor module (not illustrated) that forms the sensing area (not illustrated) that is included in the screen display area 110A and 110D.

In an embodiment, the connector hole 108 may accommodate a connector. The connector hole 108 may be disposed in the third surface 110C of the housing 110. For example, the connector hole 108 may be disposed in the third surface 110C so as to be adjacent to at least a part of the audio modules (e.g., the microphone hole 103 and the speaker hole 107). In another embodiment, the electronic device 100 may include the first connector hole 108 capable of accommodating a connector (e.g., a universal serial bus (USB) connector) for transmitting/receiving power and/or data with an external electronic device, and/or a second connector hole (not illustrated) capable of accommodating a connector (e.g., an earphone jack) for transmitting/receiving audio signals with an external electronic device.

In an embodiment, the electronic device 100 may include the light emitting element (not illustrated). For example, the light emitting element (not illustrated) may be disposed on the first surface 110A of the housing 110. The light emitting element (not illustrated) may provide state information of the electronic device 100 in the form of light. In another embodiment, the light emitting element (not illustrated) may provide a light source that operates in conjunction with operation of the camera module 105. For example, the light emitting element (not illustrated) may include an LED, an IR LED, and/or a xenon lamp.

Figure 3:
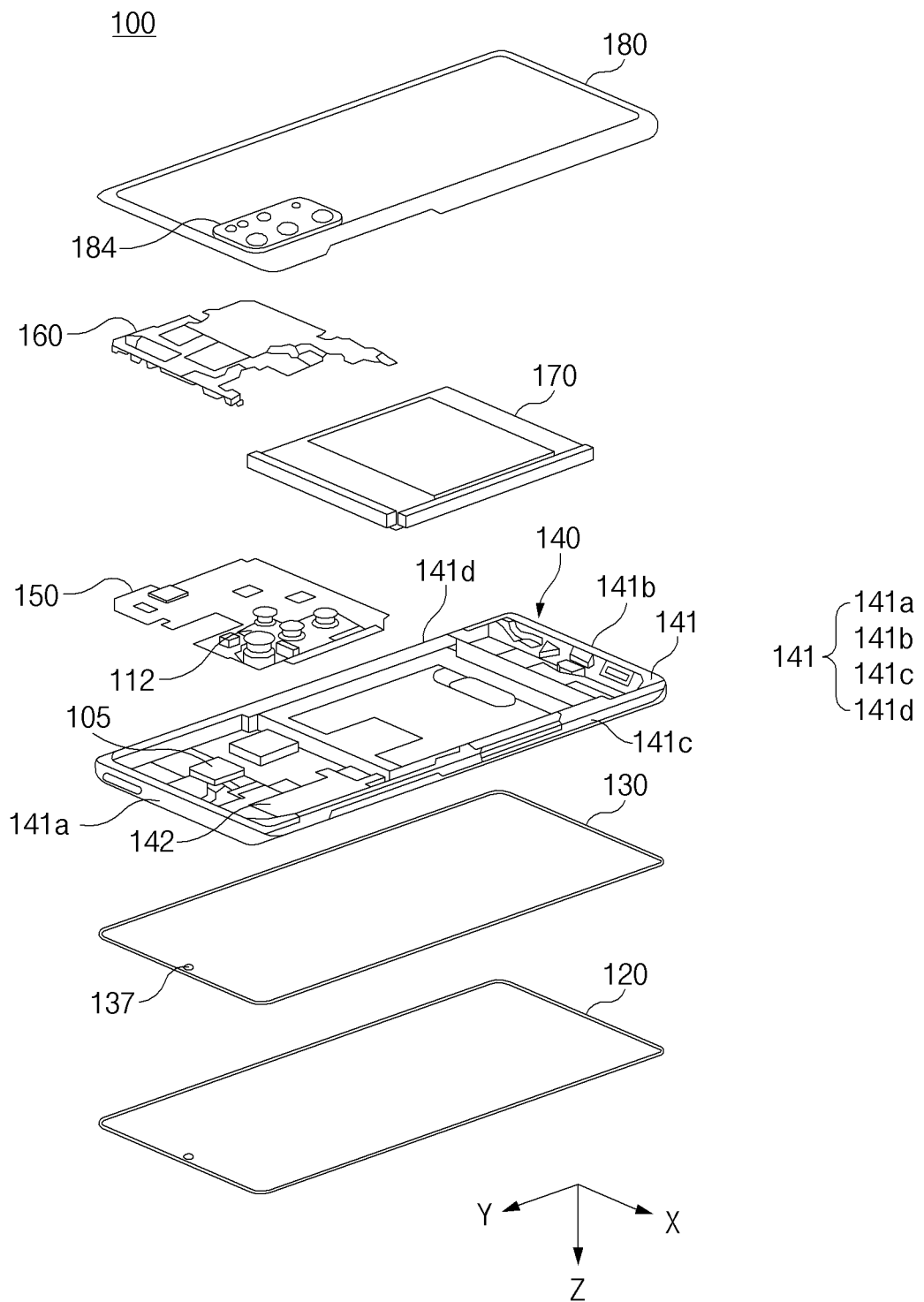
FIG. 3 is an exploded perspective view of an electronic device according to an embodiment of the disclosure.

FIG. 3 is an exploded perspective view of an electronic device according to an embodiment of the disclosure.

Referring to FIG. 3, the electronic device 100 according to an embodiment may include a front plate 120 (e.g., the front plate 102 of FIG. 11), a display 130 (e.g., the display 101 of FIG. 1), a side member 140 (e.g., the side bezel structure 118 of FIG. 1), a printed circuit board 150, a rear case 160, a battery 170, a back plate 180 (e.g., the back plate 111 of FIG. 2), and an antenna (not illustrated).

In various embodiments, the electronic device 100 may not include at least one component (e.g., the rear case 160) among the aforementioned components, or may additionally include other component(s).

Some of the components of the electronic device 100 illustrated in FIG. 3 may be identical or similar to some of the components of the electronic device illustrated in FIGS. 1 and 2 (e.g., the electronic device 100 of FIGS. 1 and 2), and therefore repetitive descriptions will hereinafter be omitted.

In an embodiment, the front plate 120, the side member 140, and the back plate 180 may form the housing (e.g., the housing 110 of FIGS. 1 and 2) of the electronic device 100. For example, the housing 110 of the electronic device 100 may be formed by a coupling of the front plate 120, the back plate 180 facing the front plate 120, and the side member 140 surrounding the space between the front plate 120 and the back plate 180.

In an embodiment, the front plate 120 and the display 130 may be coupled to the side member 140. For example, the front plate 120 and the display 130 may be disposed under the side member 140 with respect to FIG. 3. The front plate 120 and the display module 130 may be located in the +z-axis direction from the side member 140. For example, the display 130 may be coupled to the bottom of the side member 140, and the front plate 120 may be coupled to the bottom of the display 130. The front plate 120 may form a portion of the outer surface (or, the exterior) of the electronic device 100. The display 130 may be disposed between the front plate 120 and the side member 140 so as to be located inside the electronic device 100.

In an embodiment, the side member 140 may be disposed between the display module 130 and the back plate 180. For example, the side member 140 may be configured to surround the space between the back plate 180 and the display 130.

In an embodiment, the side member 140 may include a frame 141 forming a portion of the side surface (e.g., the third surface 110C of FIG. 1) of the electronic device 100 and a plate 142 extending inward from the frame 141.

In an embodiment, the frame 141 may include a first sidewall 141a and a second sidewall 141b that form portions of the longitudinal side surfaces (e.g., the side surfaces facing the y-axis direction) of the electronic device 100, and a third sidewall 141c and a fourth sidewall 141d that form portions of the lateral side surfaces (e.g., the side surfaces facing the x-axis direction) of the electronic device 100. For example, the first sidewall 141a may form the side surface facing the +y-axis direction, and the second sidewall 141b may form the side surface facing the −y-axis direction. For example, the third sidewall 141c may form the side surface facing the +x-axis direction, and the fourth sidewall 141d may form the side surface facing the −x-axis direction.

In an embodiment, the first sidewall 141a and the second sidewall 141b may be disposed to face each other and may extend in the x-axis direction. The third sidewall 141c and the fourth sidewall 141d may be disposed to face each other and may extend in the y-axis direction. The frame 141 may be configured such that the plurality of sidewalls 141a, 141b, 141c, and 141d are connected or integrated with one another. For example, the third sidewall 141c may connect one end portion (e.g., the end portion facing the +x-axis direction) of the first sidewall 141a and one end portion (e.g., the end portion facing the +x-axis direction) of the second sidewall 141*b*, and the fourth sidewall 141*d* may connect an opposite end portion (e.g., the end portion facing the −x-axis direction) of the first sidewall 141*a* and an opposite end portion (e.g., the end portion facing the −x-axis direction) of the second sidewall 141*b*.

In an embodiment, the plate 142 may be disposed inside the frame 141 so as to be surrounded by the frame 141. The plate 142 may be connected with the frame 141, or may be integrally formed with the frame 141. The plate 142 may be formed of a metallic material and/or a nonmetallic (e.g., polymer) material.

In an embodiment, the plate 142 may support other components included in the electronic device 100. For example, at least one of the display 130, the printed circuit board 150, the rear case 160, or the battery 170 may be disposed on the plate 142. For example, the display 130 may be coupled to one surface (e.g., the surface facing the +z-axis direction) of the plate 142, and the printed circuit board 150 may be coupled to a surface (e.g., the surface facing the −z-axis direction) of the plate 142 that faces away from the one surface.

In an embodiment, the rear case 160 may be disposed between the back plate 180 and the plate 142. The rear case 160 may be coupled to the side member 140 so as to overlap at least a portion of the printed circuit board 150. For example, the rear case 160 may face the plate 142 with the printed circuit board 150 therebetween.

In an embodiment, a processor (e.g., a processor 420 of FIG. 21), a memory (e.g., a memory 430 of FIG. 21), and/or an interface (e.g., an interface 477 of FIG. 21) may be mounted on the printed circuit board 150. The processor may include, for example, one or more of a central processing unit, an application processor, a graphic processing unit, an image signal processor, a sensor hub processor, or a communication processor. The memory may include, for example, a volatile memory or a nonvolatile memory. The interface may include, for example, a high definition multimedia interface (HDMI), a universal serial bus (USB) interface, a secure digital (SD) card interface, and/or an audio interface. The interface may electrically or physically connect the electronic device 100 with an external electronic device and may include a USB connector, an SD card/MMC connector, or an audio connector.

In an embodiment, the battery 170 (e.g., a battery 489 of FIG. 21) may supply power to at least one component of the electronic device 100. For example, the battery 170 may include a primary cell that is not rechargeable, a secondary cell that is rechargeable, or a fuel cell. At least a portion of the battery 170 may be disposed on substantially the same plane as the printed circuit board 150. The battery 170 may be integrally disposed inside the electronic device 100, or may be disposed so as to be detachable from the electronic device 100.

In an embodiment, the antenna (not illustrated) (e.g., an antenna module 497 of FIG. 21) may be disposed between the back plate 180 and the battery 170. The antenna (not illustrated) may include, for example, a near field communication (NFC) antenna, a wireless charging antenna, and/or a magnetic secure transmission (MST) antenna. For example, the antenna (not illustrated) may perform short-range communication with an external device, or may wirelessly transmit and receive power required for charging.

In an embodiment, the first camera module 105 (e.g., a front camera) may be disposed on at least a portion (e.g., the plate 142) of the side member 140 such that a lens receives external light through a partial area of the front plate 120 (e.g., the front surface 110A of FIG. 1). For example, the lens of the first camera module 105 may be visually exposed through a partial area (e.g., a camera area 137) of the front plate 120.

In an embodiment, the second camera module 112 (e.g., a rear camera) may be disposed in at least a portion of an inner space formed in the housing (e.g., the housing 110 of FIGS. 1 and 2) of the electronic device 100 and may be electrically connected to the printed circuit board 150 through a connecting member (e.g., a connector). In an embodiment, the second camera module 112 may be disposed on the printed circuit board 150 such that a lens receives external light through a camera area 184 of the back plate 180 (e.g., the rear surface 110B of FIG. 2) of the electronic device 100. For example, the lens of the second camera module 112 may be visually exposed through the camera area 184.

In an embodiment, the camera area 184 may be formed in a surface (e.g., the rear surface 110B of FIG. 2) of the back plate 180. In an embodiment, the camera area 184 may be formed to be at least partially transparent such that external light is incident on the lens of the second camera module 112. In an embodiment, at least a portion of the camera area 184 may protrude to a predetermined height from the surface of the back plate 180. However, without being necessarily limited thereto, the camera area 184 may form substantially the same plane as the surface of the back plate 180.

Figure 4A:
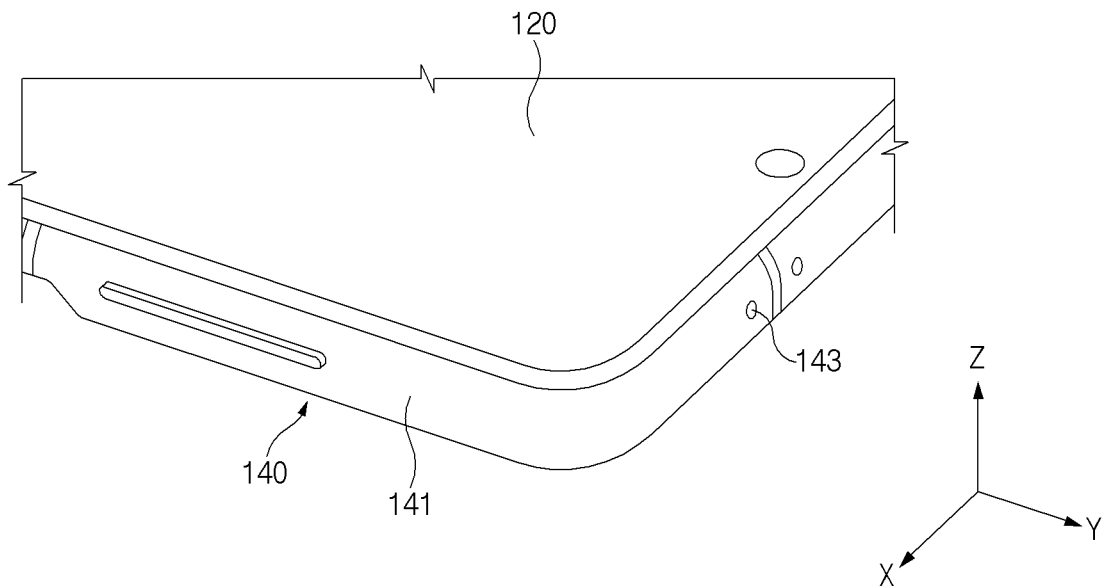
FIG. 4A illustrates a portion of an electronic device according to an embodiment of the disclosure.

FIG. 4A illustrates a portion of an electronic device according to an embodiment of the disclosure.

Figure 4B:
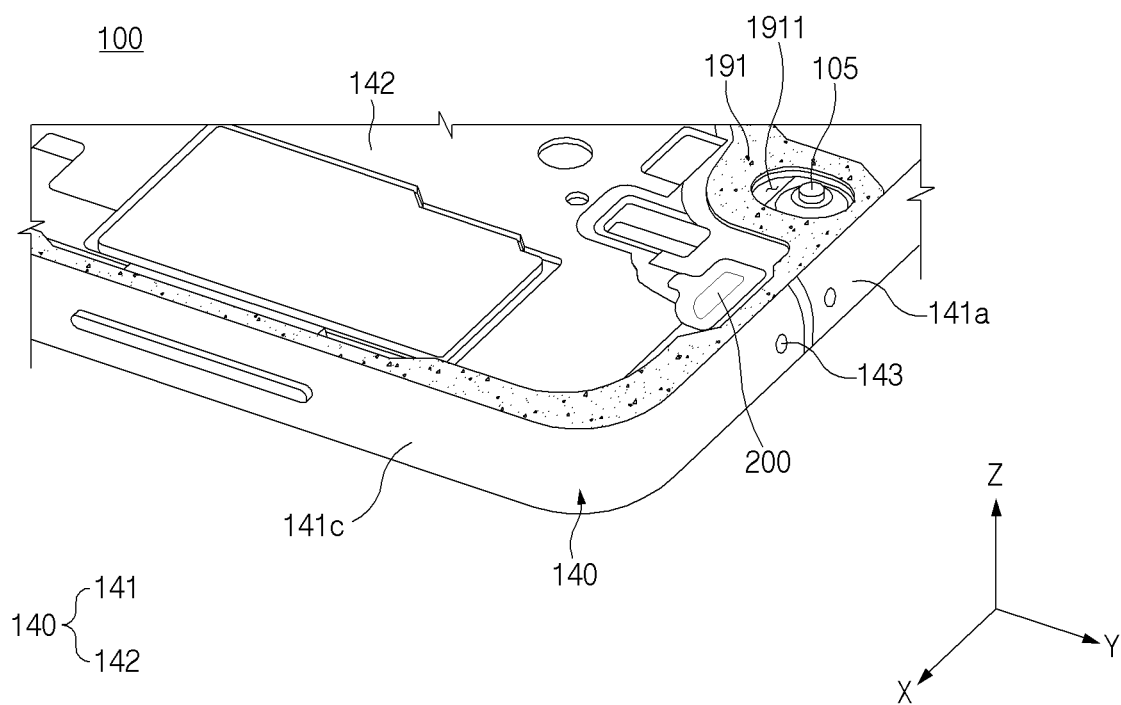
FIG. 4B illustrates a portion of an electronic device according to an embodiment of the disclosure.

FIG. 4B illustrates a portion of an electronic device according to an embodiment of the disclosure.

Figure 5:
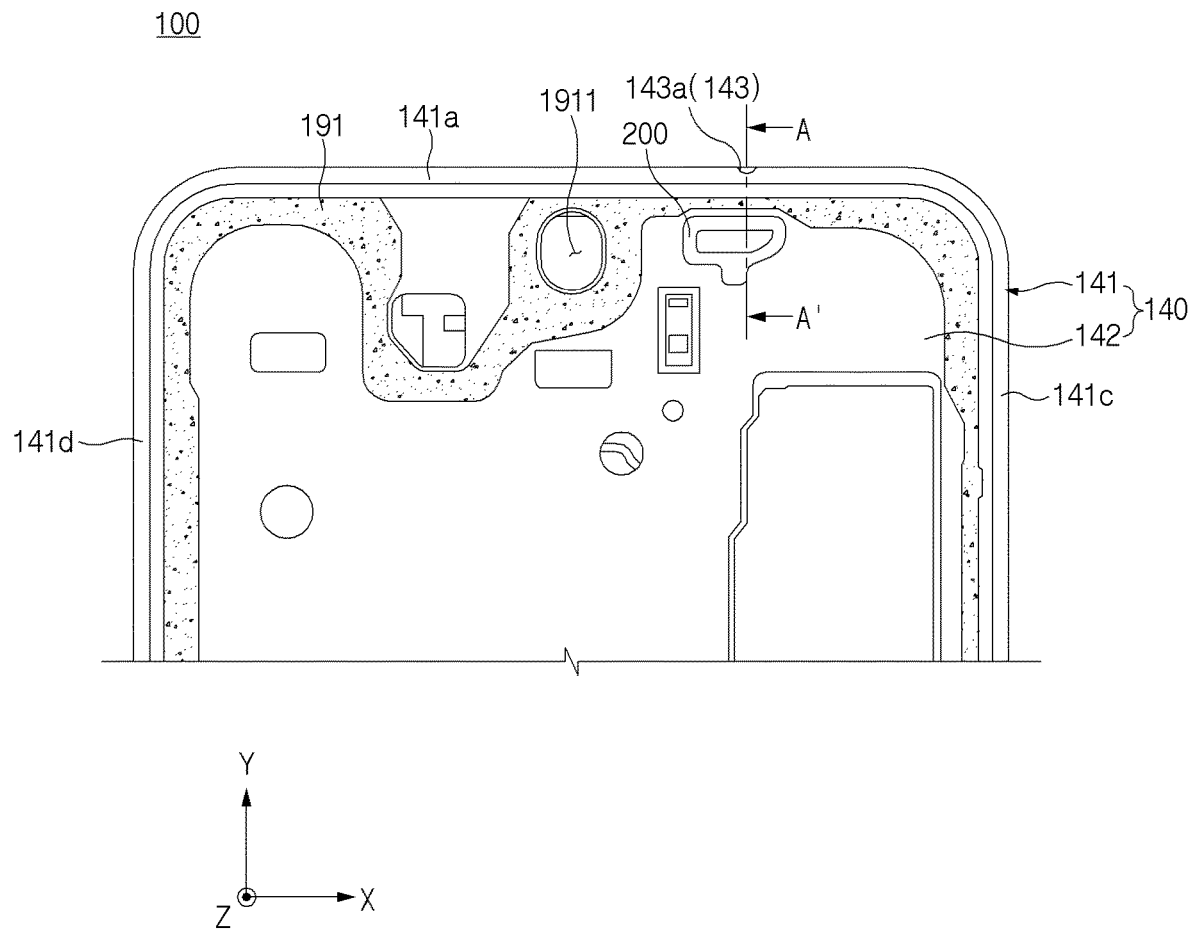
FIG. 5 is a plan view of an electronic device according to an embodiment of the disclosure.

FIG. 5 is a plan view of an electronic device according to an embodiment of the disclosure.

Figure 6:
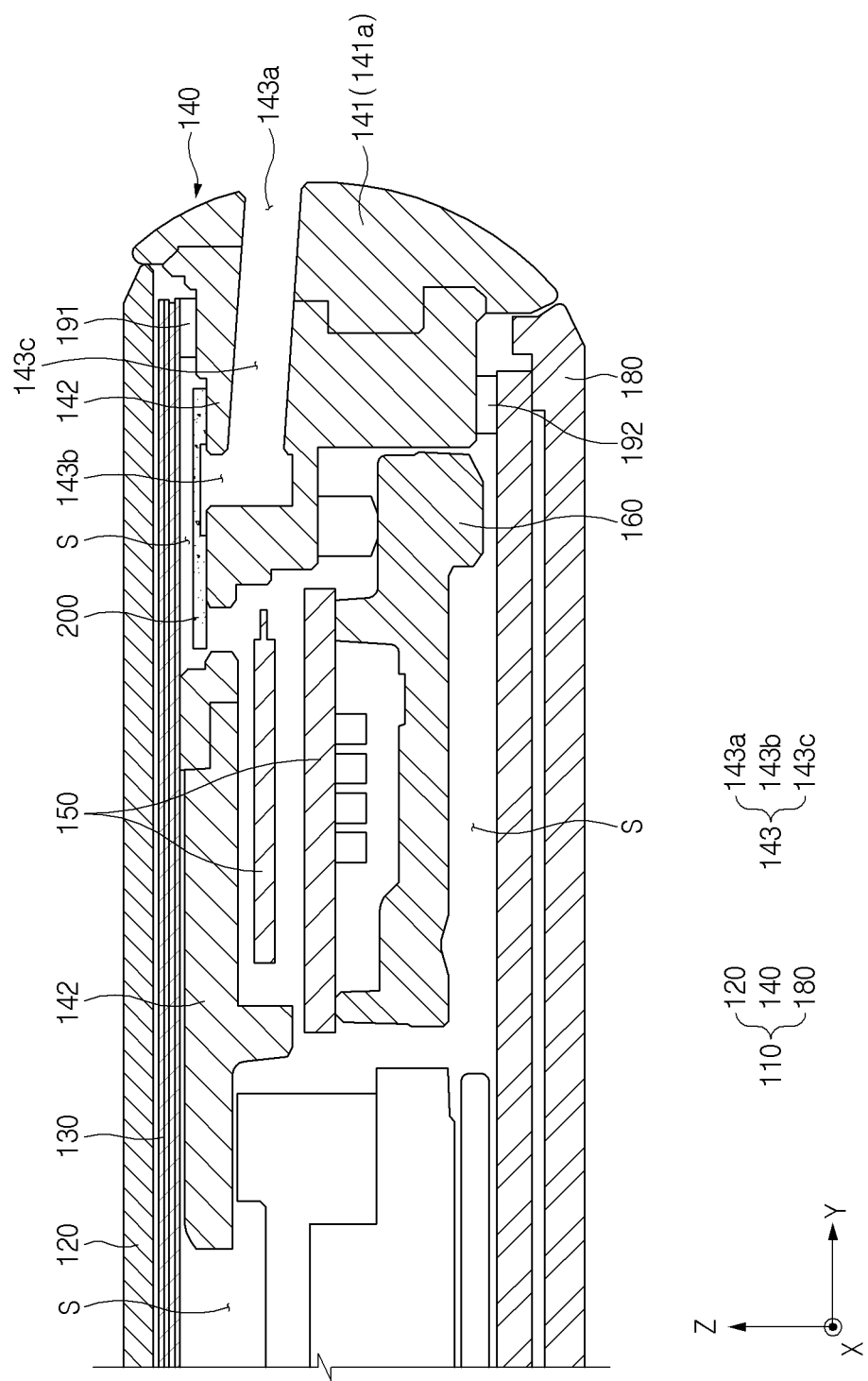
FIG. 6 is a sectional view of an electronic device according to an embodiment of the disclosure.

FIG. 6 is a sectional view of an electronic device according to an embodiment of the disclosure.

FIG. 5 may be a view in which the front plate 120 and the display 130 are omitted according to an embodiment of the disclosure.

FIG. 6 may be a sectional view of the electronic device 100 taken along line A-A' illustrated in FIG. 5 according to an embodiment of the disclosure.

Referring to FIGS. 4A, 4B, 5, and 6, the electronic device 100 according to an embodiment may include the front plate 120 (e.g., the front plate 120 of FIG. 3), the display 130 (e.g., the display 130 of FIG. 3), the side member 140 (e.g., the side member 140 of FIG. 3), the printed circuit board 150 (e.g., the printed circuit board 150 of FIG. 3), the rear case 160 (e.g., the rear case 160 of FIG. 3), the back plate 180 (e.g., the back plate 180 of FIG. 3), adhesive tapes 191 and 192, and a blocking member 200 (hereinafter, referred to as the waterproof structure 200).

Some of the components of the electronic device 100 illustrated in FIGS. 4A to 6 may be identical or similar to the components of the electronic device 100 illustrated in FIGS. 1 to 3, and therefore repetitive descriptions will hereinafter be omitted.

In an embodiment, the exterior of the electronic device 100 may be formed by a coupling structure of the front plate 120, the side member 140, and the back plate 180. For example, the housing 110 (e.g., the housing 110 of FIGS. 1 and 2) of the electronic device 100 may be formed by a coupling of the front plate 120, the side member 140, and the back plate 180.

In an embodiment, the front plate 120 and the back plate 180 may be disposed to face each other, and a portion (e.g., the frame 141) of the side member 140 may surround the space between the front plate 120 and the back plate 180 to form an inner space S of the electronic device 100 (or, the housing 110). For example, the inner space S may be understood as a predetermined space that is formed in the housing 110 and in which other components (e.g., the display 130, the printed circuit board 150, the rear case 160, and/or the waterproof structure 200) of the electronic device 100 are accommodated.

In an embodiment, the front plate 120 and the back plate 180 may be coupled with the side member 140. For example, the front plate 120 may be coupled to the plate 142 through the first adhesive tape 191 in the state of being attached to the display 130. The back plate 180 may be attached to the plate 142 through the second adhesive tape 192.

In an embodiment, at least a portion (e.g., the plate 142) of the side member 140 may be located in the inner space S between the front plate 120 and the back plate 180. In an embodiment, the display 130 may be disposed between the front plate 120 and the plate 142, and the rear case 160 and/or the printed circuit board 150 may be disposed between the back plate 180 and the plate 142. For example, the display 130, the printed circuit board 150, and the rear case 160 may be supported by the plate 142 of the side member 140 and may be located in the inner space S.

In an embodiment, the display 130 may be disposed on the rear surface (e.g., the surface facing the −z-axis direction) of the front plate 120. For example, the display 130 may be disposed on the rear surface of the front plate 120 so as to be located in the inner space S of the electronic device 100. The display 130 may be visually exposed through the front plate 120 in the direction toward the front side of the electronic device 100 (e.g., in the +z-axis direction).

In an embodiment, the display 130 may be attached to the plate 142 of the side member 140 in the state of being coupled with the front plate 120. For example, the front plate 120 may be attached to one surface (e.g., the surface facing the +z-axis direction) of the display 130, and an opposite surface (e.g., the surface facing the −z-axis direction) of the display 130 may be attached to the plate 142. The display 130 may be attached to the plate 142 through the adhesive tapes 191 and 192 disposed between the plate 142 and the display 130.

In various embodiments, the display 130 and the front plate 120 may be coupled through various adhesive members (not illustrated) to form a display assembly. The display assembly may be coupled to the side member 140 through the adhesive tapes 191 and 192. For example, it may be understood that FIGS. 4B and 5 illustrate the state in which the display assembly (e.g., the front plate 120 and the display 130) is not attached to the side member 140.

In an embodiment, the side member 140 may include the frame 141 surrounding the inner space S between the front plate 120 and the back plate 180 and the plate 142 extending from the frame 141 toward the inner space S. For example, the plate 142 may extend from the inside of the frame 141 such that at least a portion of the plate 142 is located between the front plate 120 and the back plate 180.

In an embodiment, the plate 142 may support the display 130, the printed circuit board 150, the rear case 160, and the back plate 180. For example, the display 130 and the front plate 120 may be disposed on one surface (e.g., the surface facing the +z-axis direction) of the plate 142. The printed circuit board 150, the rear case 160, and the back plate 180 may be disposed on an opposite surface (e.g., the surface facing the −z-axis direction) of the plate 142.

In an embodiment, the frame 141 may surround the plate 142. For example, the frame 141 may include a plurality of sidewalls extending along the periphery of the plate 142 to surround the plate 142.

In an embodiment, the frame 141 may include the first sidewall 141a, and the third sidewall 141c and the fourth sidewall 141d that extend to the first sidewall 141a. Although not illustrated in FIGS. 4A, 4B, 5, and 6, the frame 141 may include the second sidewall (e.g., the second sidewall 141b of FIG. 3) that faces the first sidewall 141a. For example, the third sidewall 141c and the fourth sidewall 141d may extend from the opposite end portions of the first sidewall 141a toward the second sidewall 141b.

In an embodiment, the side member 140 may include a vent hole 143 formed through at least a portion of the side member 140 such that the outside of the electronic device 100 (or, the housing 110) and the inner space S of the electronic device 100 (or, the housing 110) fluidly communicate with each other. For example, when the outside of the housing 110 and the inner space S fluidly communicate with each other, this may mean that the outside of the housing 110 and the inner space S are partially connected to enable a movement of fluid between the outside of the housing 110 and the inner space S. In various embodiments, the waterproof structure 200 may be disposed on a partial area of the side member 140 to allow for a movement of air through the vent hole 143 but prevent introduction of water into the inner space S.

In an embodiment, the vent hole 143 may be formed through the frame 141 and at least a portion of the plate 142. For example, the vent hole 143 may extend a partial area of the first sidewall 141a of the frame 141 to a partial area of the plate 142. According to the illustrated embodiment, the vent hole 143 may penetrate the first sidewall 141a. However, this is illustrative, and the position of the vent hole 143 is not limited to that illustrated. According to various embodiments, the vent hole 143 may be formed through the second sidewall 141b, the third sidewall 141c, and/or the fourth sidewall 141d.

In an embodiment, the vent hole 143 may include a first opening area 143a formed in the frame 141, a second opening area 143b formed in the plate 142, and a duct connecting the first opening area 143a and the second opening area 143b. For example, the first opening area 143a may be formed in the first sidewall 141a of the frame 141, and the duct 143c may extend from the first opening area 143a toward the second opening area 143b. For example, the duct 143c may extend from the first opening area 143a toward the inner space S (e.g., in the −y-axis direction), and at least a portion of the duct 143c may be connected with the second opening area 143b. For example, at least a portion of the duct 143c may extend toward the display 130 (e.g., in the +z-axis direction) such that the second opening area 143b is open toward the display 130. In various embodiments, the duct 143c may extend from the first sidewall 141a of the frame 141 to a partial area of the plate 142.

In an embodiment, as the first opening area 143a of the vent hole 143 is formed in the first sidewall 141a, the first opening area 143a of the vent hole 143 may be exposed on an outer surface (e.g., the side surface facing the +y-axis direction) of the electronic device 100. As the second opening area 143b of the vent hole 143 is formed in the plate 142, the second opening area 143b of the vent hole 143 may be located in the inner space S. For example, fluid outside the electronic device 100 may move into the duct 143c through the first opening area 143a. In various embodiments, the first sidewall 141a having the first opening area 143a formed therein and the plate 142 having the second opening area 143b formed therein may be substantially perpendicular to each other, and the duct 143c may be formed in a shape in which at least a portion is inclined or bent such that the duct 143c penetrates from a partial area of the first sidewall 141a to a partial area of the plate 142.

In an embodiment, the second opening area 143b may be covered by the waterproof structure 200. For example, when the front plate 120 or the display 130 of the electronic device 100 is viewed from above, the second opening area 143b of the vent hole 143 may overlap the waterproof structure 200. As illustrated in FIGS. 4B and 5, when the plate 142 is viewed from above (e.g., in the +z-axis direction), the second opening area 143b may not be visually exposed as the second opening area 143b overlaps the waterproof structure 200 and is hidden by the waterproof structure 200. For example, the second opening area 143b and the inner space S may be configured such that a movement of liquid (e.g., water) therebetween is interrupted by the waterproof structure 200, but air is movable therebetween.

In an embodiment, the first opening area 143a and the second opening area 143b may be defined as areas that form opposite end portions of the vent hole 143 having a predetermined shape. The duct 143c may extend to connect the first opening area 143a and the second opening area 143b, and the shape of the vent hole 143 may be substantially determined by the direction and shape in which the duct 143c extends. According to various embodiments, the waterproofing effect of the electronic device 100 may be improved depending on the shape and the inclined direction of the duct 143c. Various embodiments of the shape of the duct 143c will be described below with reference to FIGS. 15 and 16.

The electronic device 100 according to an embodiment may be configured such that air moves from the outside of the electronic device 100 to the inner space S or from the inner space S to the outside of the electronic device 100 through the vent hole 143. For example, air outside the housing 110 may flow into the duct 143c through the first opening area 143a and may move into the inner space S through the second opening area 143b and the waterproof structure 200. For example, even though liquid (e.g., water) flows from the outside of the electronic device 100 into the duct 143c through the first opening area 143a, the liquid may fail to pass through the waterproof structure 200 covering the second opening area 143b, and therefore a movement of the liquid into the inner space S may be interrupted.

According to an embodiment, the electronic device 100 may maintain the air pressure outside the electronic device 100 and the air pressure inside the electronic device 100 at the same pressure through the vent hole 143, thereby reducing defects in various components (e.g., a sensor) of the electronic device 100 due to a difference between the air pressure outside the electronic device 100 and the air pressure inside the electronic device 100.

In an embodiment, the adhesive tapes 191 and 192 may include the first adhesive tape 191 for attaching the display 130 to the side member 140 and the second adhesive tape 192 for attaching the back plate 180 to the side member 140. In an embodiment, the first adhesive tape 191 and/or the second adhesive tape 192 may contain a waterproof material. For example, the first adhesive tape 191 and/or the second adhesive tape 192 may be a waterproof tape.

In an embodiment, the first adhesive tape 191 may be disposed between the plate 142 of the side member 140 and the display 130. For example, a portion of the first adhesive tape 191 may be disposed between the periphery of the plate 142 and the display 130. The display 130 may be attached to the plate 142 through the first adhesive tape 191. The first adhesive tape 191 may partially seal the space between the plate 142 and the display 130.

In an embodiment, the first adhesive tape 191 may surround the area around the first camera module 105. For example, the first adhesive tape 191 may have, in at least a portion thereof, an opening 1911 in which the first camera module 105 is disposed. When the first adhesive tape 191 is attached to the plate 142 and the display 130 is attached to the first adhesive tape 191, the first camera module 105 may face the rear surface (e.g., the surface facing the −z-axis direction) of the display 130 through the opening 1911.

In an embodiment, the second adhesive tape 192 may be disposed between the plate 142 of the side member 140 and the back plate 180. The second adhesive tape 192 may partially seal the space between the plate 142 and the back plate 180.

In an embodiment, the waterproof structure 200 may interrupt a movement of liquid outside the electronic device 100 into the inner space S through the vent hole 143. The waterproof structure 200 may be located between the display 130 and the plate 142 and may be attached to the plate 142. For example, the waterproof structure 200 may be disposed at the position on the plate 142 that overlaps the second opening area 143b of the vent hole 143. The waterproof structure 200 may interrupt a flow path of liquid between the second opening area 143b and the inner space S.

In an embodiment, the waterproof structure 200 may be attached to a partial area (e.g., a bonding area 144 of FIG. 7) of the plate 142 to cover the second opening area 143b. The waterproof structure 200 may be configured to interrupt a movement of liquid (e.g., water) into the inner space S and allow for a movement of gas (e.g., air) into the inner space S. For example, the waterproof structure 200 may be implemented by using a material (e.g., Gore-Tex) through which liquid cannot pass and air can pass. In various embodiments, the waterproof structure 200 may include a waterproof ventilation sheet (e.g., a membrane 210 of FIGS. 8, 9A, and 9B). The structure of the waterproof structure 200 and components thereof will be described below in more detail with reference to FIGS. 8, 9A, 9B, 10, and 11.

Figure 7:
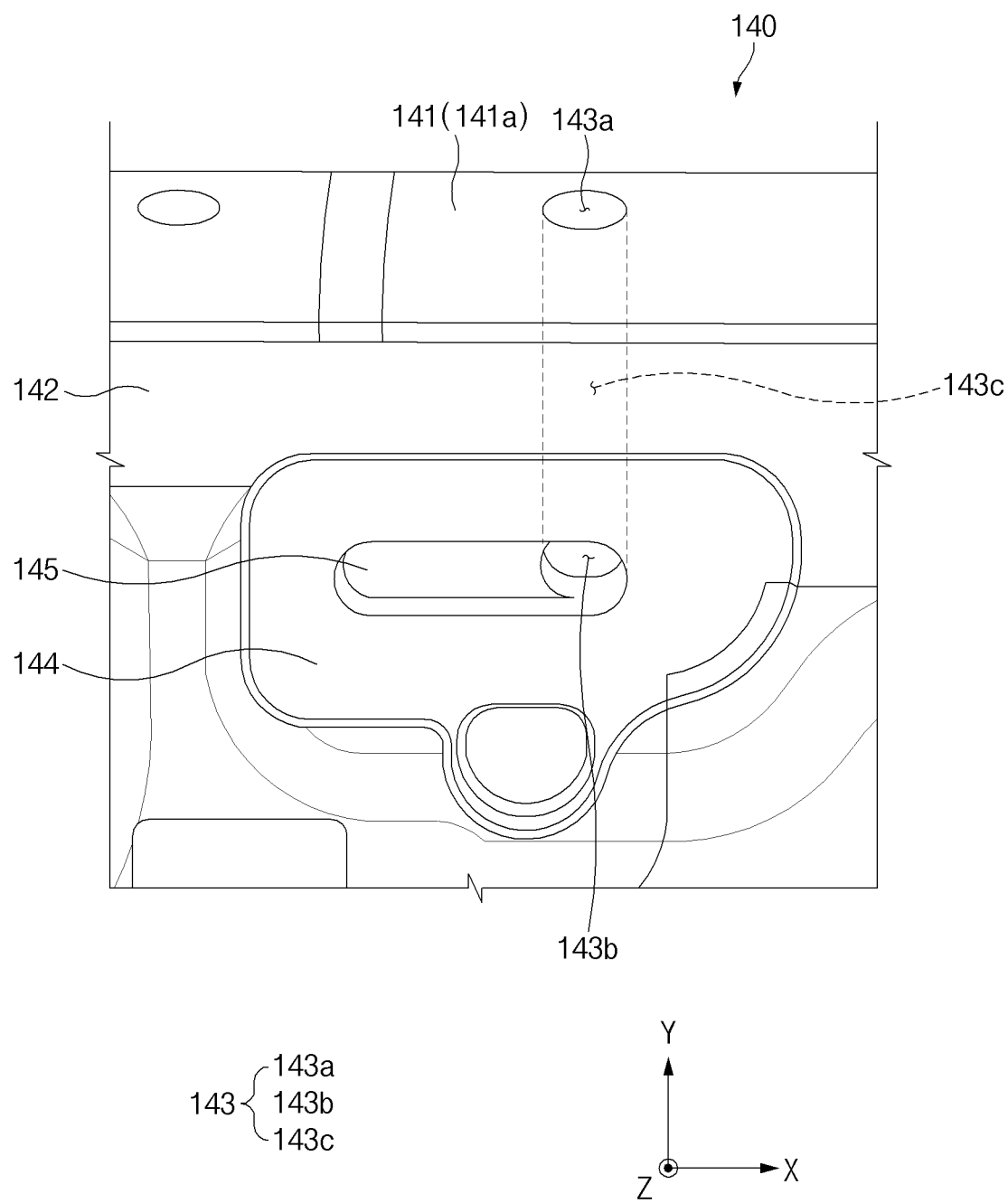
FIG. 7 illustrates a portion of a side member of an electronic device according to an embodiment of the disclosure.

FIG. 7 illustrates a portion of a side member of an electronic device according to an embodiment of the disclosure.

FIG. 7 may be a view illustrating the portion of the side member 140 in which the vent hole 143 is formed and the portion of the side member 140 on which the waterproof structure (e.g., the waterproof structure 200 of FIGS. 4A, 4B, 5, and 6) is disposed.

FIG. 7 may be a view illustrating the state in which the waterproof structure 200 and an adhesive tape (e.g., the first adhesive tape 191 of FIGS. 4A, 4B, 5, and 6) are not attached to the side member 140.

Referring to FIG. 7, the side member 140 of the electronic device 100 according to an embodiment may include the bonding area 144 on which the waterproof structure 200 is disposed. Although the waterproof structure 200 is not illustrated in FIG. 7, the waterproof structure 200 may be attached to the bonding area 144. In various embodiments, the bonding area 144 may be formed in a shape substantially corresponding to the waterproof structure 200.

In an embodiment, the side member 140 may include the frame 141 and the plate 142. The frame 141 of the side member 140 illustrated in FIG. 7 may be referred to as the first sidewall (e.g., the first sidewall 141a of FIGS. 4A, 4B, 5, and 6) in which the vent hole 143 is formed.

In an embodiment, the vent hole 143 may include the first opening area 143*a* formed in the first sidewall 141*a*, the duct 143*c* extending from the first opening area 143*a* toward the plate 142, and the second opening area 143*b* extending from the duct 143*c* so as to be formed in a partial area of the plate 142. For example, the first opening area 143*a* may refer to the opening area formed in a portion of the first sidewall 141*a*. The second opening area 143*b* may refer to the opening area formed in a portion of the plate 142. The duct 143*c* may refer to the passage extending to connect the first opening area 143*a* and the second opening area 143*b*. In various embodiments, the first opening area 143*a* may be open in the lateral direction of the electronic device 100 (e.g., in the +y-axis direction), and the second opening area 143*b* may be open in the direction toward the front side of the electronic device 100 (e.g., in the +z-axis direction).

In an embodiment, the bonding area 144 may be formed on a portion of the plate 142. For example, the bonding area 144 may be formed around the area of the plate 142 in which the second opening area 143*b* is formed. The second opening area 143*b* may be formed at the position overlapping the boding area 144. For example, the bonding area 144 may be formed on a partial area of the plate 142, and the second opening area 143*b* may penetrate a portion of the bonding area 144. As illustrated in FIG. 7, the second opening area 143*b* may be located within the bonding area 144. In various embodiments, the waterproof structure 200 may be attached to the bonding area 144 and may cover the second opening area 143*b* accordingly.

In an embodiment, a partial area of the plate 142 may be recessed to form the bonding area 144. For example, a partial area of the plate 142 may be recessed in a predetermined shape, and the bonding area 144 may be connected with the other area of the plate 142 with a step therebetween. As illustrated in FIG. 7, the bonding area 144 may be concavely recessed in the direction toward the rear side of the electronic device 100 (e.g., in the −z-axis direction). However, the shape of the bonding area 144 is not limited to the illustrated embodiment. According to various embodiments, the bonding area 144 may form substantially the same plane as the other areas of the plate 142.

In an embodiment, the plate 142 may include a recess 145 connected with the second opening area 143*b*. The recess 145 may be formed in the bonding area 144 of the plate 142. For example, a portion of the bonding area 144 may be recessed to form the recess 145. The recess 145 may have a predetermined length and may extend substantially parallel to the first sidewall 141*a*.

In an embodiment, the recess 145 may be connected with, or may fluidly communicate with, the second opening area 143*b* such that fluid (e.g., liquid and/or gas) passing through the second opening area 143*b* moves into the recess 145. For example, at least a portion of the recess 145 may be connected with the second opening area 143*b*. The recess 145 may be formed such that at least a portion thereof overlaps the second opening area 143*b*. For example, as illustrated in FIG. 7, when the bonding area 144 is viewed from above or the front (e.g., when the side member 140 is viewed in the −z-axis direction), the recess 145 may be located in the bonding area 144, and the second opening area 143*b* may be located in the recess 145. The second opening area 143*b* may be located adjacent to one end portion of the recess 1445. However, the relative positions of the second opening area 143*b* and the recess 145 are not limited to the illustrated embodiment. According to various embodiments, the second opening area 143*b* may be located in the middle of the recess 145.

In an embodiment, the recess 145 may provide a predetermined space for securing an amount of air introduced through the vent hole 143 (an amount of ventilation). For example, as the recess 145 is connected with the bonding area 144 with a step therebetween, the predetermined space surrounded by the recess 145 and the waterproof structure 200 may be formed when the waterproof structure (e.g., the waterproof structure 200 of FIGS. 4A, 4B, 5, and 6) is attached to the bonding area 144. In various embodiments, the space formed by the recess 145 and the waterproof structure 200 may be used as a space for reducing pressure applied to the waterproof structure 200 by water passing through the second opening area 143*b*. For example, at least a portion of water passing through the second opening area 143*b* may flow in the space between the recess 145 and the waterproof structure 200, and thus water pressure applied to the waterproof structure 200 may be reduced.

Figure 8:
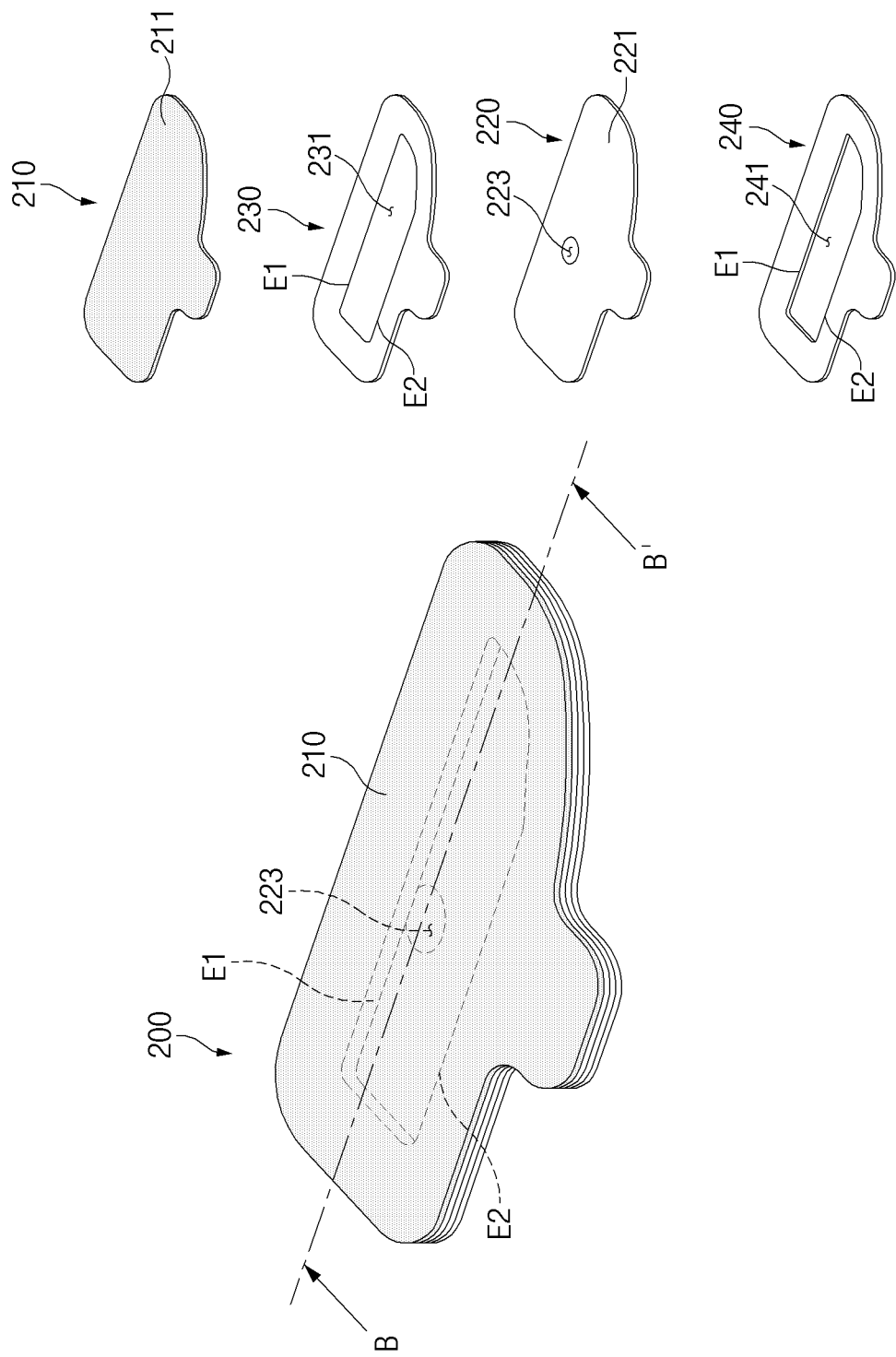
FIG. 8 illustrates a waterproof structure of an electronic device according to an embodiment of the disclosure.

FIG. 8 illustrates a waterproof structure of an electronic device according to an embodiment of the disclosure.

FIG. 9A illustrates a waterproof structure of an electronic device according to an embodiment of the disclosure.

FIG. 9B illustrates a waterproof structure of an electronic device according to an embodiment of the disclosure.

FIG. 8 may illustrate a perspective view and an exploded perspective view of the waterproof structure 200. FIGS. 9A and 9B may be sectional views of the waterproof structure 200 taken along line B-B' illustrated in FIG. 8.

Referring to FIGS. 8, 9A, and 9B, the waterproof structure 200 according to an embodiment may include the membrane 210, a cover member 220, a first adhesive member 230, and a second adhesive member 240. For example, the waterproof structure 200 may be formed in a structure in which the membrane 210, the first adhesive member 230, the cover member 220, and the second adhesive member 240 are stacked one above another.

In an embodiment, the membrane 210 may be formed of a waterproof and air-permeable material. For example, the membrane 210 may provide a waterproof function of blocking liquid introduced from outside the electronic device 100 and may pass gas through the membrane 210. In various embodiments, the membrane 210 may be a ventilation waterproof sheet or a waterproof ventilation sheet. For example, the membrane 210 may contain a Gore-Tex material. However, the material of the membrane 210 is not limited to the above-described example and may be formed of various waterproof and air-permeable materials.

In an embodiment, the membrane 210 may include a first surface 211 and a second surface facing away from the first surface 211. For example, when the waterproof structure 200 is attached to the bonding area 144, the first surface 211 may face toward the display 130, and the second surface 212 may face toward the bonding area 144 (or, the plate 142 of the side member 140). The membrane 210 may be attached to the cover member 220 through the first adhesive member 230. For example, the second surface 212 of the membrane 210 may be attached to the cover member 220 through the first adhesive member 230.

In an embodiment, the cover member 220 may be attached to the second surface 212 of the membrane 210. The cover member 220 may be formed of a material through which fluid (liquid and/or gas) cannot pass. For example, the cover member 220 may be formed of polyethylene terephthalate (PET). However, the material of the cover member 220 is not limited to the above-described example and may be formed of various waterproof and non-breathable materials.

In an embodiment, a through-hole 223 may be formed in a partial area of the cover member 220. For example, the cover member 220 may include a third surface 221 facing the second surface 212 of the membrane 210 and a fourth surface 222 facing away from the third surface 221. The through-hole 223 may penetrate the third surface 221 and the fourth surface 222.

In an embodiment, the through-hole 223 may provide a passage through which fluid outside the electronic device 100 moves toward the membrane 210. For example, the fluid may move into the space between the membrane 210 and the cover member 220 through the through-hole 223 as the cover member 220 is formed of a waterproof and non-breathable material. According to an embodiment, liquid introduced from outside the electronic device 100 may move through the through-hole 223 of the cover member 220, and thus the pressure that the liquid directly applies or transmits to the membrane 210 by contact with the membrane 210 may be reduced. In various embodiments, the through-hole 223 of the cover member 220 may be formed to be smaller than openings 231 and 241 of the adhesive members 230 and 240.

In an embodiment, the cover member 220 may be attached to the membrane 210 so as to be spaced apart from the second surface 212 of the membrane 210 by a predetermined gap G. For example, the third surface 221 of the cover member 220 may be attached to the second surface 212 of the membrane 210 through the first adhesive member 230, and the second surface 212 of the membrane 210 and the third surface 221 of the cover member 220 may be spaced apart from each other by the predetermined gap G by the first adhesive member 230 (e.g., refer to FIG. 9A). For example, the predetermined gap G between the membrane 210 and the cover member 220 may be about 0.02 mm or more, but is not limited thereto.

In an embodiment, the cover member 220 may secure an amount of ventilation of the membrane 210 as the cover member 220 is attached to the membrane 210 so as to be spaced apart from the membrane 210 by the predetermined gap G. For example, the area (or, space) by which the membrane 210 makes contact with air may be secured by the predetermined gap G between the cover member 220 and the membrane 210.

In an embodiment, the gap G between the cover member 220 and the membrane 210 may vary as the pressure P of liquid (e.g., water pressure) is applied to the cover member 220. For example, when the water pressure P is transmitted to the cover member 220, at least a portion of the cover member 220 may be moved toward the membrane 210 by the water pressure P and may partially make contact with the membrane 210 (e.g., refer to FIG. 9B). According to an embodiment, when liquid is introduced from outside the electronic device 100, most of the pressure P of the liquid may be applied to the cover member 220, and thus the pressure of the liquid transmitted to the membrane 210 may be reduced.

In an embodiment, the first adhesive member 230 may be disposed between the membrane 210 and the cover member 220. For example, the first adhesive member 230 may be disposed between the second surface 212 of the membrane 210 and the third surface 221 of the cover member 220 and may attach the membrane 210 and the cover member 220 to each other. For example, the both sides of the first adhesive member 230 may be attached to the membrane 210 and the cover member 220, respectively. In various embodiments, the first adhesive member 230 may include a double-sided tape.

In an embodiment, the first opening 231 may be formed in the central area of the first adhesive member 230. For example, the first adhesive member 230 may be formed in a ring shape corresponding to the shapes of the peripheries of the membrane 210 and the cover member 220.

In an embodiment, the second adhesive member 240 may be disposed on the fourth surface 222 of the cover member 220. For example, the second adhesive member 240 may attach the cover member 220 to the bonding area 144. In various embodiments, the second adhesive member 240 may be disposed between the fourth surface 222 of the cover member 220 and the bonding area (e.g., the bonding area 144 of FIG. 7). For example, the both sides of the second adhesive member 240 may be attached to the cover member 220 and the bonding area 144, respectively. In various embodiments, the second adhesive member 240 may include a double-sided tape.

In an embodiment, the second opening 241 may be formed in the central area of the second adhesive member 240. For example, the second adhesive member 240 may be formed in a ring shape corresponding to the shapes of the peripheries of the membrane 210 and the cover member 220. In various embodiments, the first adhesive member 230 and the second adhesive member 240 may be formed in substantially the same shape. For example, the shapes and/or sizes of the first opening 231 and the second opening 241 may be substantially the same as each other.

In an embodiment, the first opening 231 of the first adhesive member 230 and the second opening 241 of the second adhesive member 240 may overlap the through-hole 223 of the cover member 220. For example, the through-hole 223 may be located inside the first opening 231 and the second opening 241. In various embodiments, the through-hole 223 may be located adjacent to one of the edges of the first opening 231 and the second opening 241. For example, each of the first opening 231 and the second opening 241 may include a first edge E1 and a second edge E2 that face each other in parallel. The through-hole 223 may be formed in a position adjacent to one of the first edge E1 and the second edge E2. As illustrated in FIG. 8, the through-hole 223 may be located closer to the first edges E1 of the openings 231 and 241 than to the second edges E2 of the openings 231 and 241. However, the position of the through-hole 223 is not limited to the illustrated embodiment.

Figure 10:
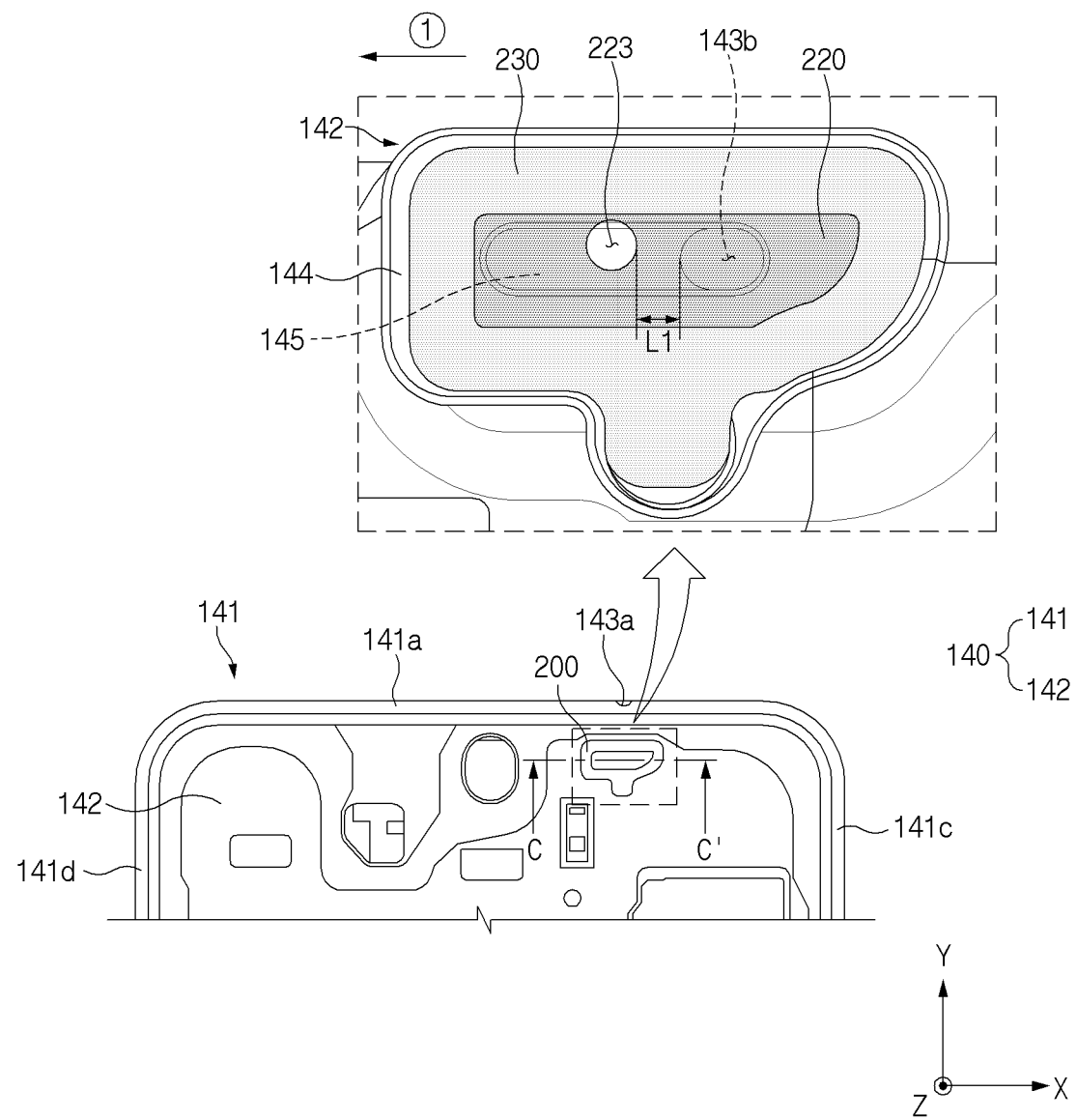
FIG. 10 illustrates a side member and a waterproof structure of an electronic device according to an embodiment of the disclosure.

FIG. 10 illustrates a side member and a waterproof structure of an electronic device according to an embodiment of the disclosure.

Figure 11:
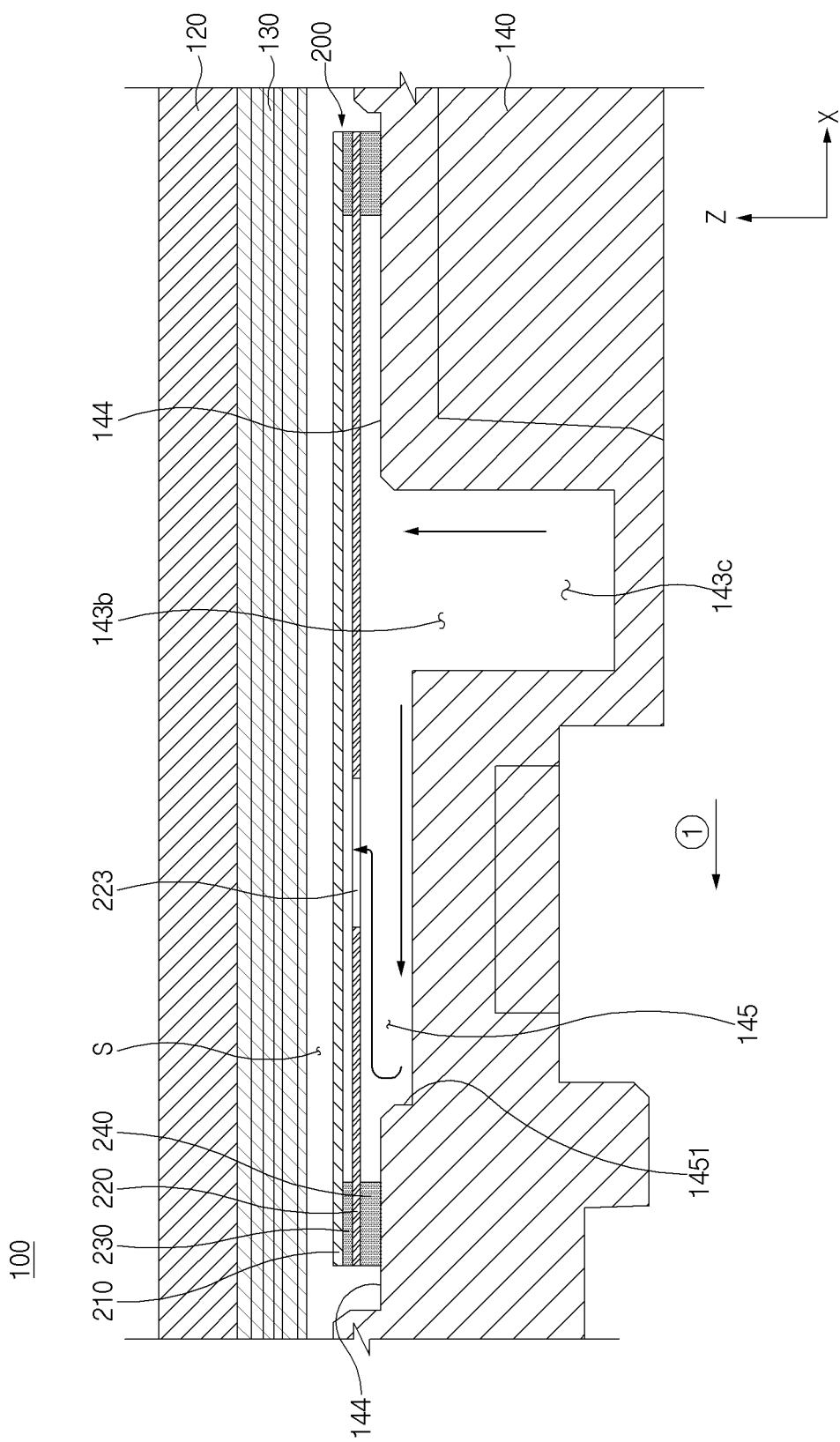
FIG. 11 illustrates a section of a portion of an electronic device according to an embodiment of the disclosure.

FIG. 11 illustrates a section of a portion of an electronic device according to an embodiment of the disclosure.

FIG. 10 may be a view illustrating the bonding area 144 to which the waterproof structure 200 is attached. For example, the enlarged view of FIG. 10 may be a view in which the membrane 210 is omitted to describe the position of the through-hole 223 formed in the cover member 220.

FIG. 11 may be a sectional view of the electronic device 100 taken along line C-C' illustrated in FIG. 10 according to an embodiment of the disclosure. For example, FIG. 11 may be a view for explaining a flow path of liquid introduced from outside the electronic device 100.

Referring to FIGS. 10 and 11, the electronic device 100 according to an embodiment may include the side member 140 (e.g., the side member 140 of FIGS. 4A, 4B, 5, 6, and 7) having the vent hole 143 formed therein and the waterproof structure 200 (e.g., the waterproof structure 200 of FIGS. 8, 9A, and 9B) disposed on the side member 140 to cover the vent hole 143.

Some of the components of the side member 140 and the waterproof structure 200 illustrated in FIGS. 10 and 11 may be identical or similar to the components of the side member 140 and the waterproof structure 200 illustrated in FIGS. 4A to 9B, and therefore repetitive descriptions will hereinafter be omitted.

In an embodiment, the side member 140 may include the frame 141 and the plate 142, and the bonding area 144 to which the waterproof structure 200 is attached may be formed on the plate 142. For example, the bonding area 144 may be formed in a shape corresponding to the waterproof structure 200. In various embodiments, the bonding area 144 may be formed to be larger than the waterproof structure 200. For example, the waterproof structure 200, when attached to the bonding area 144, may be surrounded by the periphery of the bonding area 144.

In an embodiment, the waterproof structure 200 may be attached to the bonding area 144 of the plate 142. The waterproof structure 200 may include the membrane 210, the cover member 220 attached to the rear surface (e.g., the surface facing the −z-axis direction or the second surface 212 of FIGS. 9A and 9B) of the membrane 210, the first adhesive member 230 that attaches the membrane 210 and the cover member 220 to each other, and the second adhesive member 240 that attaches the cover member 220 to the bonding area 144. For example, the waterproof structure 200 may be attached to the bonding area 144 such that the membrane 210 faces the display 130 and the cover member 220 is located between the membrane 210 and the plate 142.

In an embodiment, the waterproof structure 200 may cover a partial area of the vent hole 143. For example, the waterproof structure 200 may cover the second opening area 143b of the vent hole 143 by attachment to the bonding area 144. The waterproof structure 200 may provide a waterproof function by interrupting a movement of liquid passing through the second opening area 143b into the inner space S of the electronic device 100. The waterproof structure 200 may overlap the second opening area 143b in the +z-axis direction with respect to FIGS. 10 and 11. For example, when the waterproof structure 200 is viewed from the front or above, the second opening area 143b may overlap at least a portion of the waterproof structure 200.

In an embodiment, the waterproof structure 200 may be configured such that the through-hole 223 of the cover member 220 does not overlap the second opening area 143b. For example, the through-hole 223 of the cover member 220 may be located so as not to be aligned with the second opening area 143b. As illustrated in FIG. 10, when the waterproof structure 200 is viewed from the front or above, the through-hole 223 may be located to be spaced apart from the second opening area 143b by a predetermined gap (e.g., a first distance L1) in a first direction ⊕ (e.g., the −x-axis direction) parallel to the first sidewall 141a. For example, the first distance L1 may refer to the distance between the periphery of the through-hole 223 and the periphery of the second opening area 143b adjacent to each other that is measured in a direction parallel to the first direction ⊕. For example, as the through-hole 223 is located so as not to be aligned with the second opening area 143b, at least a portion of liquid passing through the second opening area 143b may not be directly introduced into the through-hole 223 and may pass through the through-hole 223 after flowing in the space between the recess 145 and the waterproof structure 200. For example, when the waterproof structure 200 is viewed from the front or above, the through-hole 223 may be located to be spaced apart from the second opening area 143b by about 1 mm or more in the first direction ⊕ (e.g., the −x-axis direction) parallel to the first sidewall 141a. However, the first distance L1 is not limited to the aforementioned numerical value.

In an embodiment, the through-hole 223 of the cover member 220 may be located between the opposite end portions of the recess 145 when the waterproof structure 200 is viewed from the front or above. For example, the second opening area 143b may overlap the one end portion of the recess 145, and the through-hole 223 may overlap the central portion of the recess 145. For example, as the through-hole 223 is located to overlap the central portion of the recess 145, liquid passing through the second opening area 143b may not be introduced into the through-hole 223 immediately after moving to the opposite end portion (e.g., the end portion in the first direction ⊕) of the recess 145. Accordingly, the flow path of the liquid may be elongated, and the pressure that the liquid applies to the membrane 210 by direct contact with the membrane 210 may be reduced.

Hereinafter, an operation in which the pressure of liquid is reduced by the waterproof structure 200 according to the embodiment of the disclosure when the liquid is introduced from outside the electronic device 100 will be described with reference to FIG. 11.

In an embodiment, liquid outside the electronic device 100 may be introduced into the duct 143c through the first opening area 143a. The liquid introduced into the duct 143c may move toward the second opening area 143b.

In an embodiment, the liquid passing through the second opening area 143b may collide with the cover member 220 of the waterproof structure 200. The liquid may fail to pass through the cover member 220, and the pressure of the liquid may be reduced by the collision with the cover member 220.

In an embodiment, the flow path of the liquid may be changed by the cover member 220. For example, after the collision with the cover member 220, the liquid passing through the second opening area 143b may move in the first direction and may flow into the recess 145. At least a portion of the liquid introduced into the recess 145 may collide with the end portion of the recess 145 that faces the first direction 1, and the pressure of the liquid may be reduced.

In an embodiment, at least a portion of the liquid introduced into the recess 145 may flow in the recess 145 and thereafter may pass through the through-hole 223 of the cover member 220. For example, the liquid moving in the first direction ⊕ and flowing into the recess 145 may collide with the end portion 1451 of the recess 145 that faces the first direction ⊕, and therefore the flow path may be changed to the direction opposite to the first direction ⊕.

In an embodiment, the liquid passing through the through-hole 223 may be in a low-pressure state as the liquid collides with the cover member 220 and flows in the recess 145. The waterproof structure 200 according to the embodiment may include the cover member 220 having the through-hole 223 formed therein and thus may reduce the pressure of the liquid finally delivered to the membrane 210. For example, the through-hole 223 of the cover member 220 may not be aligned with the second opening area 143b in the z-axis direction, and thus the liquid passing through the second opening area 143b may move toward the recess 145 without directly passing through the through-hole 223. For example, the through-hole 223 of the cover member 220 may be located between the end portion 1451 of the recess 145, which faces the first direction ⊕, and the second opening area 143b. Accordingly, the path along which the liquid flows to reach the through-hole 223 may be increased, and the pressure of the liquid may be reduced.

In an embodiment, as the liquid passing through the second opening area 143b collides with the cover member 220, at least a portion of the cover member 220 may be moved toward the membrane 210 by the pressure of the liquid. For example, at least a portion of the cover member 220 may be brought into close contact with the membrane 210 by the pressure of the liquid. Accordingly, the area of the membrane 210 making contact with the liquid may be decreased, and the pressure of the liquid transmitted to the membrane 210 may be reduced.

Figure 12:
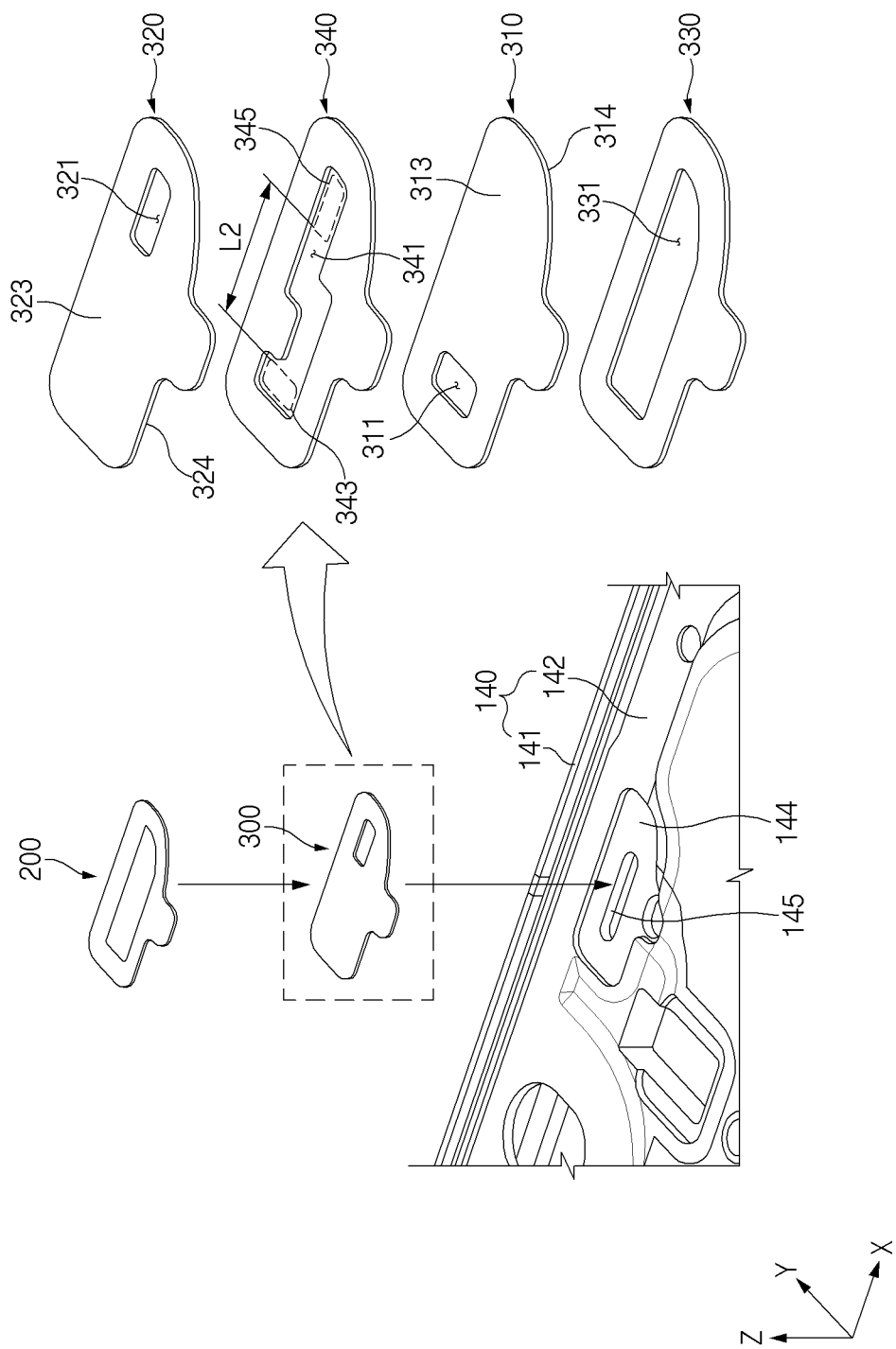
FIG. 12 illustrates a side member, a waterproof structure, and a layer structure of an electronic device according to an embodiment of the disclosure.

FIG. 12 illustrates a side member, a waterproof structure, and a layer structure of an electronic device according to an embodiment of the disclosure.

FIG. 12 may be a view illustrating an operation in which the waterproof structure 200 and the layer structure 300 are coupled to the side member 140 and a state in which the layer structure 300 is disassembled.

Referring to FIG. 12, the electronic device 100 according to an embodiment may include the side member 140 including the frame 141 and the plate 142, and the waterproof structure 200 and the layer structure 300 that are disposed on the bonding area 144 of the side member 140.

Some of the components of the side member 140 and the waterproof structure 200 illustrated in FIG. 12 may be identical or similar to the components of the side member 140 and the waterproof structure 200 illustrated in FIGS. 4A, 4B, 5, 6, 7, 8, 9A, 9B, 10, and 11. For example, the waterproof structure 200 may be referred to as the waterproof structure 200 illustrated in FIGS. 8, 9A, 9B, 10, and 11 and may include a membrane (e.g., the membrane 210 of FIGS. 8, 9A, 9B, 10, and 11), a cover member (e.g., the cover member 220 of FIGS. 8, 9A, 9B, 10, and 11), and adhesive members (e.g., the first adhesive member 230 and the second adhesive member 240 of FIGS. 8, 9A, 9B, 10, and 11). Hereinafter, repetitive descriptions will be omitted.

In an embodiment, the layer structure 300 may be disposed between the waterproof structure 200 and the bonding area 144. For example, the layer structure 300 may be attached to the bonding area 144, and the waterproof structure 200 may be attached above the layer structure 300 (e.g., in the +z-axis direction). For example, the layer structure 300 may be formed in a shape corresponding to the bonding area 144 and the waterproof structure 200. In various embodiments, fluid (liquid and/or gas) introduced into a vent hole (e.g., the vent hole 143 of FIGS. 4A, 4B, 5, 6, and 7) of the side member 140 may move to the waterproof structure 200 through the layer structure 300.

In an embodiment, the layer structure 300 may contain a material through which fluid cannot pass. For example, the fluid may move toward the waterproof structure 200 through an opening area formed in the layer structure 300. The layer structure 300 may be configured to provide a passage through which the fluid introduced into the vent hole 143 moves.

In an embodiment, the layer structure 300 may include a first sheet 310, a second sheet 320, a third adhesive member 330, and a fourth adhesive member 340. For example, the layer structure 300 may be formed in a structure in which the second sheet 320, the fourth adhesive member 340, the first sheet 310, and the third adhesive member 330 are stacked one above another.

In an embodiment, the first sheet 310 may be attached to the bonding area 144. For example, the first sheet 310 may be attached to the bonding area 144 through the third adhesive member 330. The first sheet 310 may be formed of a material through which fluid (liquid and/or gas) cannot pass. For example, the first sheet 310 may be formed of polyethylene terephthalate (PET). However, the material of the first sheet 310 is not limited to the above-described example and may be formed of various waterproof and non-breathable materials.

In an embodiment, the first sheet 310 may include a fifth surface 313 and a sixth surface 314 facing away from the fifth surface 313. The fifth surface 313 may face toward the second sheet 320 and the fourth adhesive member 340, and the sixth surface 314 may face toward the bonding area 144 and the third adhesive member 330. For example, the sixth surface 314 of the first sheet 310 may be attached with the third adhesive member 330.

In an embodiment, a first hole 311 may be formed in the first sheet 310. The first hole 311 may form a flow passage of fluid together with opening areas (e.g., a second hole 321, a third opening 331, and a fourth opening 341) that are formed in the second sheet 320, the third adhesive member 330, and the fourth adhesive member 340. For example, the first hole 311 may be connected with a partial area of the third opening 331 of the third adhesive member 330 and a partial area of the fourth opening 341 of the fourth adhesive member 340. For example, the first hole 311 may partially overlap the third opening 331 and the fourth opening 341. The first hole 311 may not overlap the second hole 321 of the second sheet 320.

In an embodiment, the second sheet 320 may be attached to the first sheet 310. For example, the second sheet 320 may be attached to the first sheet 310 through the fourth adhesive member 340. The second sheet 320 may be formed of a material through which fluid (liquid and/or gas) cannot pass. For example, the second sheet 320 may be formed of polyethylene terephthalate (PET). However, the material of the second sheet 320 is not limited to the above-described example. In various embodiments, the second sheet 320 may be formed of substantially the same material as the first sheet 310.

In an embodiment, the second sheet 320 may include a seventh surface 323 and an eighth surface 324 facing away from the seventh surface 323. The seventh surface 323 may face toward the waterproof structure 200, and the eighth surface 324 may face toward the first sheet 310 and the fourth adhesive member 340. The waterproof structure 200 may be disposed on the seventh surface 323 of the second sheet 320. For example, the seventh surface 323 of the second sheet 320 may be attached with the waterproof structure 200 (e.g., the second adhesive member 240 of the waterproof structure 200 of FIGS. 8, 9A, 9B, 10, and 11). For example, the eighth surface 324 of the second sheet 320 may be attached with the fourth adhesive member 340.

In an embodiment, the second hole 321 may be formed in the second sheet 320. The second hole 321 may form a flow passage of fluid together with opening areas (e.g., the first hole 311, the third opening 331, and the fourth opening 341) that are formed in the first sheet 310, the third adhesive member 330, and the fourth adhesive member 340. For example, the second hole 321 may be connected to a partial area of the fourth opening 341 of the fourth adhesive member 340. For example, the second hole 321 may partially overlap the fourth opening 341. The second hole 321 may not overlap the first hole 311 of the first sheet 310.

In an embodiment, the third adhesive member 330 may be disposed between the first sheet 310 and the bonding area 144. For example, the third adhesive member 330 may attach the first sheet 310 to the bonding area 144. For example, the both sides of the third adhesive member 330 may be attached to the first sheet 310 and the bonding area 144, respectively. In various embodiments, the third adhesive member 330 may include a double-sided tape.

In an embodiment, the third opening 331 may be formed in the central area of the third adhesive member 330. The third opening 331 may be formed in the central area of the third adhesive member 330 to have a predetermined length. A partial area of the third opening 331 may be connected with the first hole 311 of the first sheet 310. For example, when the third adhesive member 330 is attached to the first sheet 310, one end portion of the third opening 331 may overlap the first hole 311.

In an embodiment, the fourth adhesive member 340 may be disposed between the first sheet 310 and the second sheet 320. For example, the fourth adhesive member 340 may attach the first sheet 310 and the second sheet 320 to each other. For example, the both sides of the fourth adhesive member 340 may be attached to the first sheet 310 and the second sheet 320, respectively. In various embodiments, the fourth adhesive member 340 may include a double-sided tape.

In an embodiment, the fourth opening 341 may be formed in the central area of the fourth adhesive member 340. The fourth opening 341 may be formed in the central area of the fourth adhesive member 340 to have a predetermined length. A partial area (e.g., a first area 343) of the fourth opening 341 may be connected with the first hole 311 of the first sheet 310, and another partial area (e.g., a second area 345) may be connected with the second hole 321 of the second sheet 320. For example, when the fourth adhesive member 340 is attached to the first sheet 310 and the second sheet 320, the first area 343 (or, one end portion) of the fourth opening 341 may overlap the first hole 311 and a portion of the third opening 331, and the second area 345 (or, an opposite end portion) of the fourth opening 341 may overlap the second hole 321. The first area 343 and the second area 345 may be located to be spaced apart from each other by a second distance L2 in the x-axis direction to correspond to the positions of the first hole 311 and the second hole 321.

In an embodiment, the first hole 311 of the first sheet 310, the second hole 321 of the second sheet 320, the third opening 331 of the third adhesive member 330, and the fourth opening 341 of the fourth adhesive member 340 may fluidly communicate with each other or may be connected with each other, and thus the layer structure 300 may provide a passage through which fluid moves. In various embodiments, fluid introduced into the vent hole 143 may move to the waterproof structure 200 through the passage formed by the layer structure 300. For example, when liquid is introduced into the vent hole 143, the pressure of the liquid may be reduced while the liquid passes through the passage of the layer structure 300. Accordingly, the pressure of the liquid transmitted to the waterproof structure 200 may be reduced, and the waterproof function of the electronic device 100 may be improved. An operation in which liquid passes through the layer structure 300 will be described below with reference to FIGS. 13 and 14.

Figure 13:
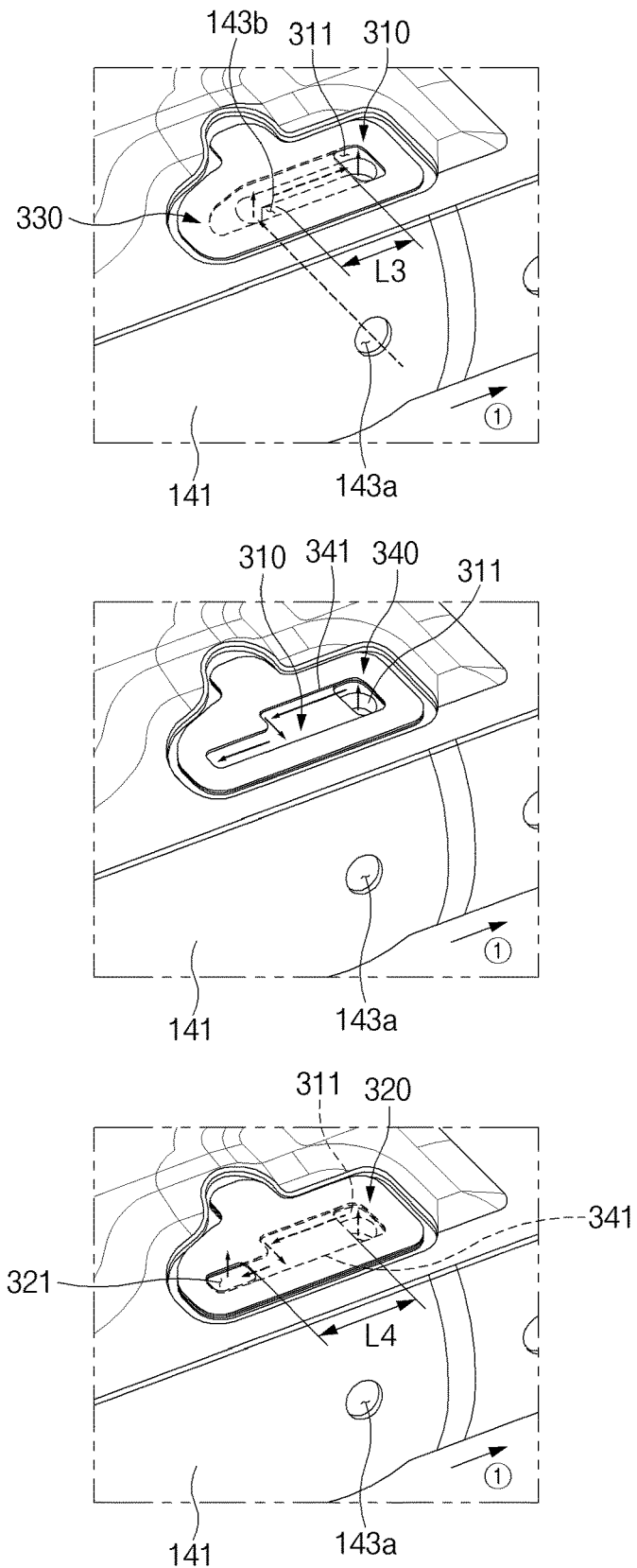
FIG. 13 illustrates a section of a portion of an electronic device according to an embodiment of the disclosure.

FIG. 13 illustrates a section of a portion of an electronic device according to an embodiment of the disclosure.

Figure 14:
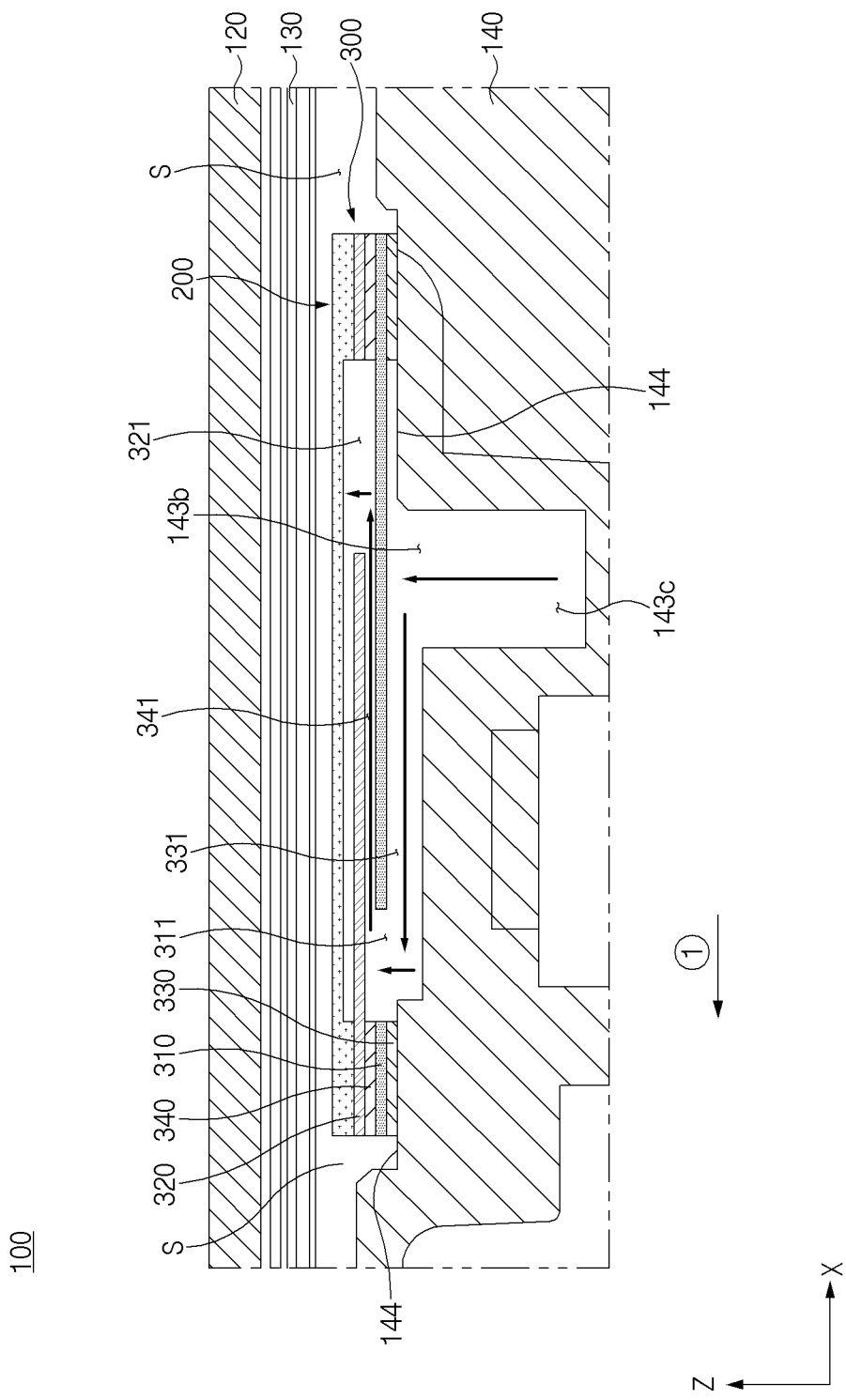
FIG. 14 illustrates a side member and a layer structure of an electronic device according to an embodiment of the disclosure.

FIG. 14 illustrates a side member and a layer structure of an electronic device according to an embodiment of the disclosure.

FIGS. 13 and 14 may be views for explaining a flow path of liquid introduced from outside the electronic device 100. For example, FIG. 14 may be a view illustrating an operation in which the components of the layer structure 300 are sequentially attached.

Referring to FIGS. 13 and 14, the electronic device 100 according to an embodiment may include the front plate 120, the display 130, the side member 140, the waterproof structure 200, and the layer structure 300.

In an embodiment, the waterproof structure 200 may be attached to the second sheet 320 of the layer structure 300 so as to be located between the layer structure 300 and the display 130. For example, the waterproof structure 200 illustrated in FIG. 14 may be referred to as the waterproof structure 200 of FIGS. 8, 9A, 9B, 10, and 11.

In an embodiment, the layer structure 300 may be attached to the bonding area 144 of the plate 142. The layer structure 300 may include the first sheet 310 attached to the bonding area 144, the second sheet 320 attached to the first sheet 310, the third adhesive member 330 attaching the first sheet 310 to the bonding area 144, and the fourth adhesive member 340 attaching the second sheet 320 to the first sheet 310.

In an embodiment, the layer structure 300 may be attached to the bonding area 144 and may cover the second opening area 143b of the vent hole 143 accordingly. The layer structure 300 may overlap the second opening area 143b in the +z-axis direction with respect to FIGS. 13 and 14. For example, when the layer structure 300 is viewed from the front or above, the second opening area 143b may overlap at least a portion of the layer structure 300.

In an embodiment, the layer structure 300 may be configured such that the first hole 311 of the first sheet 310 does not overlap the second opening area 143b. For example, the first hole 311 of the first sheet 310 may be located so as not to be aligned with the second opening area 143b in the z-axis direction. With respect to FIG. 14, when the layer structure 300 is viewed from the front or above, the first hole 311 may be located to be spaced apart from the second opening area 143b by a specified third distance L3 in the first direction ⊕. For example, with respect to FIG. 14, when the layer structure 300 is viewed from the front or above, the first hole 311 may be located to be spaced apart from the second opening area 143b by about 1 mm or more in the first direction ⊕. However, the third distance L3 is not limited to the aforementioned numerical value.

In an embodiment, the layer structure 300 may be configured such that the second hole 321 of the second sheet 320 does not overlap the first hole 311 of the first sheet 310. For example, the second hole 321 of the second sheet 320 may be located so as not to be aligned with the first hole 311 in the z-axis direction. With respect to FIG. 14, when the layer structure 300 is viewed from the front or above, the second hole 321 may be located to be spaced apart from the first hole 311 by a specified fourth distance L4 in the direction opposite to the first direction ⊕. For example, with respect to FIG. 14, when the layer structure 300 is viewed from the front or above, the second hole 321 may be located to be spaced apart from the first hole 311 by about 1 mm or more in the direction opposite to the first direction ⊕. However, the fourth distance L4 is not limited to the aforementioned numerical value. In an embodiment, the first hole 311 of the first sheet 310 may be connected with the third opening 331 of the third adhesive member 330 and the fourth opening 341 of the fourth adhesive member 340. For example, with respect to FIG. 14, when the layer structure 300 is viewed from the front or above, the first hole 311 may overlap a partial area of the third opening 331 and a partial area of the fourth opening 341. For example, the partial areas of the third opening 331 and the fourth opening 341 may be areas adjacent to an end portion facing the first direction ⊕.

In an embodiment, the second hole 321 of the second sheet 320 may be connected with the fourth opening 341 of the fourth adhesive member 340. For example, with respect to FIG. 14, when the layer structure 300 is viewed from the front or above, the second hole 321 may overlap another partial area of the fourth opening 341. For example, the fourth opening 341 may be configured such that the area overlapping the first hole 311 is spaced apart from the area overlapping the second hole 321 by a specified distance (e.g., the second distance L2 of FIG. 12) in the first direction d. For example, the area of the fourth opening 341 that overlaps the second hole 321 may be an area (e.g., the second area 345 of FIG. 12) that is adjacent to an end portion facing the direction (e.g., the +x-axis direction) opposite to the first direction d. For example, the fourth opening 341 may be configured such that the area (e.g., the first area 343 of FIG. 12) overlapping the first hole 311 is spaced apart from the area (e.g., the second area 345 of FIG. 12) overlapping the second hole 321 by about 1 mm or more in the first direction d (e.g., the −x-axis direction with respect to FIG. 12). However, the distance (e.g., the second distance L2) between the first area 343 and the second area 345 is not limited to the aforementioned numerical value.

Hereinafter, an operation in which the pressure of liquid is reduced by the layer structure 300 according to the embodiment of the disclosure when the liquid is introduced from outside the electronic device 100 will be described with reference to FIGS. 13 and 14.

In an embodiment, liquid outside the electronic device 100 may be introduced into the duct 143c through the first opening area 143a. The liquid introduced into the duct 143c may move toward the second opening area 143b.

In an embodiment, the liquid passing through the second opening area 143b may collide with the first sheet 310 of the layer structure 300. The liquid may fail to pass through the first sheet 310, and the pressure of the liquid may be reduced by the collision with the first sheet 310.

In an embodiment, the flow path of the liquid passing through the second opening area 143b may be changed by the first sheet 310. For example, the liquid passing through the second opening area 143b, after colliding with the first sheet 310, may move in the first direction d and may pass through the first hole 311 of the first sheet 310. At this time, the pressure of the liquid may be reduced while the liquid collides with the inside surface of the side member 140 before passing through the first hole 311.

In an embodiment, the liquid passing through the first hole 311 may collide with the second sheet 320. The liquid may fail to pass through the second sheet 320, and the pressure of the liquid may be reduced by the collision with the second sheet 320.

In an embodiment, the flow path of the liquid passing through the first hole 311 may be changed by the second sheet 320. For example, the liquid passing through the first hole 311, after colliding with the second sheet 320, may move in the direction opposite to the first direction d and may pass through the second hole 321 of the second sheet 320. In various embodiments, the liquid passing through the first hole 311 may move toward the second hole 321 along the fourth opening 341 of the fourth adhesive member 340. For example, the fourth opening 341 may be formed in a shape in which at least a portion is curved or bent, and thus the pressure of the liquid moving along the fourth opening 341 may be reduced.

According to an embodiment, the electronic device 100 may include, between the waterproof structure 200 and the vent hole 143, the layer structure 300 having a flow passage formed therein, and thus the flow path of the liquid moving toward the waterproof structure 200 may be implemented to be long and complicated.

Figure 15:
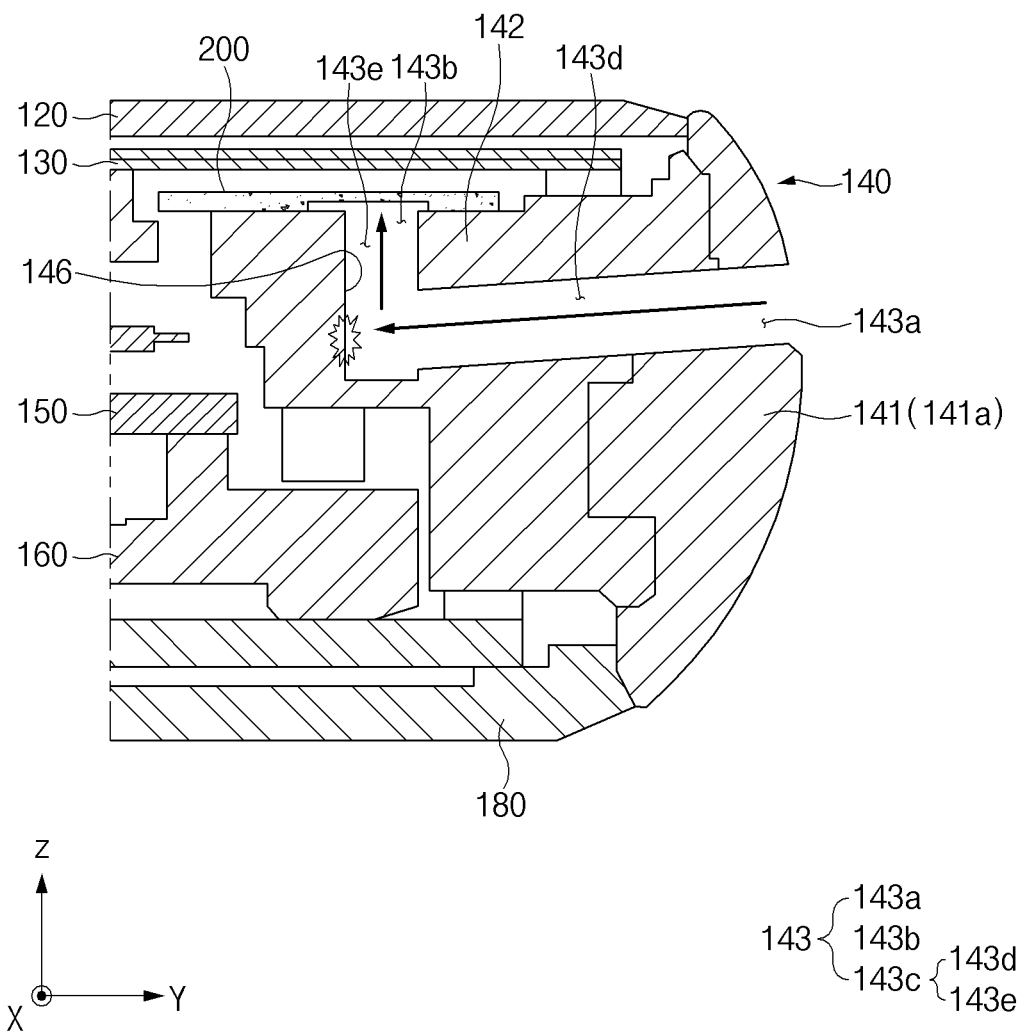
FIG. 15 illustrates a section of a portion of an electronic device according to an embodiment of the disclosure.

FIG. 15 illustrates a section of a portion of an electronic device according to an embodiment of the disclosure.

Figure 16:
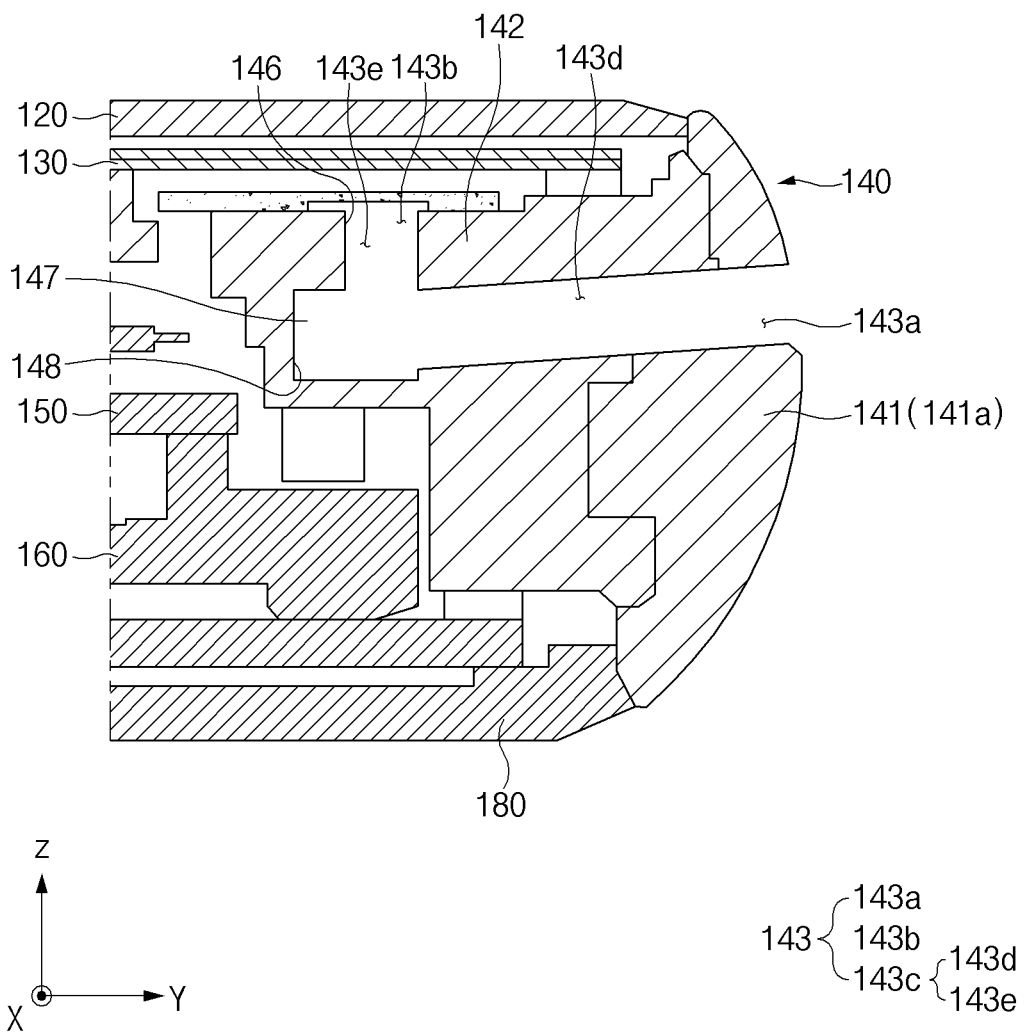
FIG. 16 illustrates a section of a portion of an electronic device according to an embodiment of the disclosure.

FIG. 16 illustrates a section of a portion of an electronic device according to an embodiment of the disclosure.

FIGS. 15 and 16 may be views illustrating embodiments in which the shape of the vent hole 143 is changed, as compared with the section of the electronic device 100 illustrated in FIG. 6.

Referring to FIG. 15, the electronic device 100 according to an embodiment may include the front plate 120, the display 130, the side member 140, the printed circuit board 150, the rear case 160, the back plate 180, and the waterproof structure 200.

In an embodiment, the side member 140 may include the vent hole 143 that passes through the frame 141 and at least a portion of the plate 142. For example, the vent hole 143 may include the first opening area 143a formed in the frame 141, the second opening area 143b formed in the plate 142, and the duct 143c connecting the first opening area 143a and the second opening area 143b.

In an embodiment, the vent hole 143 may be formed such that at least a portion of the duct 143c extends to be inclined in a direction away from the waterproof structure 200. For example, the duct 143c may include a first portion 143d extending from the first opening area 143a toward the inner space S and a second portion 143e extending from the first portion 143d toward the second opening area 143b.

In an embodiment, the first portion 143d of the duct 143c may be formed to be inclined in a direction (e.g., the −z-axis direction) toward the back plate 180 with an approach to the inner space S. For example, the first portion 143d may be formed in a shape farther away from the waterproof structure 200 and/or the second opening area 143b with an approach to the inner space S.

In an embodiment, as the first portion 143d is formed to be inclined in the direction away from the waterproof structure 200, the flow path along which liquid introduced into the duct 143c reaches the waterproof structure 200 may be elongated, and the direction in which the liquid moves may be changed.

In an embodiment, the length of the second portion 143e of the duct 143c may be changed depending on the degree to which the first portion 143d is inclined. For example, the length of the second portion 143e may be increased with an increase in the degree to which the first portion 143d is inclined toward the back plate 180.

In an embodiment, the liquid introduced into the duct 143c may be farther away from the waterproof structure 200 as the liquid moves along the first portion 143d. The liquid passing through the first portion 143d may collide with an inside surface 146 of the second portion 143e, and thus the pressure of the liquid may be reduced. For example, as the liquid passing through the first opening area 143a passes through the duct 143c formed to be inclined toward the back plate 180, the pressure of the liquid may be lowered, and thus the pressure of the liquid transmitted to the waterproof structure 200 may be reduced.

Referring to FIG. 16, a recessed area 147 connected with the duct 143c of the vent hole 143 may be formed on the side member 140 of the electronic device 100 according to an embodiment.

FIG. 16 may be a view illustrating an embodiment in which the recessed area 147 is additionally formed in the electronic device 100 illustrated in FIG. 15. Hereinafter, repetitive descriptions will be omitted, and the following description will be focused on the changed portion.

In an embodiment, at least a portion of the inside surface 146 of the second portion 143e may be concavely recessed to form the recessed area 147. For example, the recessed area 147 may be connected with the first portion 143d and the second portion 143e. The recessed area 147 may provide a space into which liquid moving along the first portion 143d is introduced. For example, the liquid passing through the first portion 143d may be introduced into the recessed area 147 and may collide with an inside surface 148 of the recessed area 147, and thus the pressure of the liquid may be reduced.

According to an embodiment, a space in which the liquid introduced into the duct 143c flows may be secured by the recessed area 147, and the flow path along which the liquid introduced into the duct 143c reaches the waterproof structure 200 may be elongated.

Figure 17:
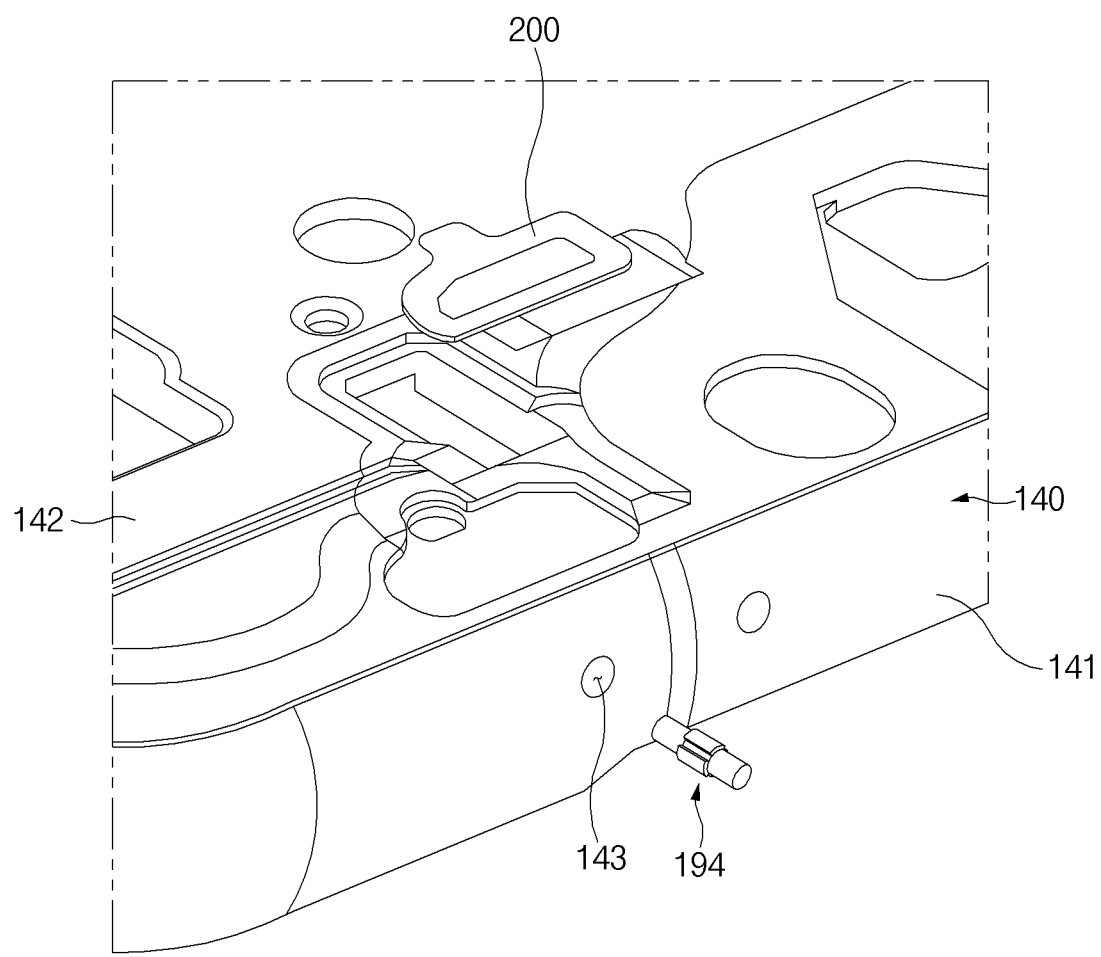
FIG. 17 illustrates the side member and a pin of an electronic device according to an embodiment of the disclosure.

FIG. 17 illustrates a side member and a pin of an electronic device according to an embodiment of the disclosure.

Figure 18:
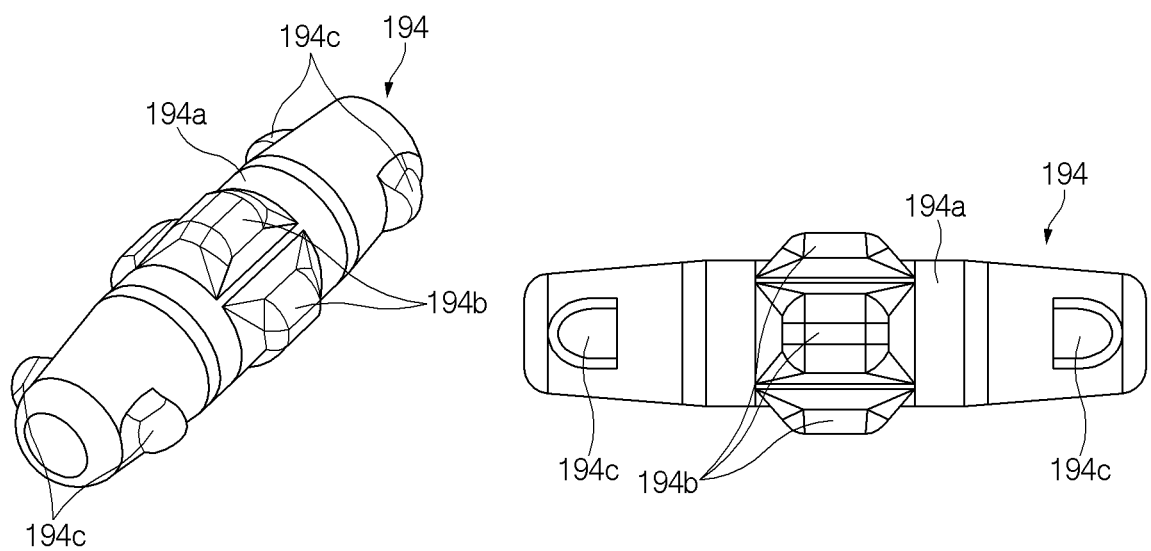
FIG. 18 illustrates the pin of an electronic device according to an embodiment of the disclosure.

FIG. 18 illustrates a pin of an electronic device according to an embodiment of the disclosure.

Referring to FIGS. 17 and 18, the electronic device 100 according to an embodiment may include the side member 140, the waterproof structure 200, and the pin 194.

In an embodiment, the side member 140 may include the vent hole 143 extending from a partial area of the frame 141 to a partial area of the plate 142. In an embodiment, the pin 194 may be inserted into at least a portion of the vent hole 143. For example, the vent hole 143 may be configured such that the area or size of an opening area is decreased by the pin 194 inserted into the vent hole 143.

In an embodiment, the pin 194 may be inserted into the vent hole 143. For example, the pin 194 may be inserted into the vent hole 143 through the first opening area 143a of the vent hole 143 formed in the frame 141. In various embodiments, the pin 194 may be located in the duct (e.g., the duct 143c of FIGS. 19 and 20) of the vent hole 143. A coupling structure of the pin 194 and the vent hole 143 will be described below with reference to FIGS. 19 and 20.

In an embodiment, the pin 194 may include a body 194a, first protrusions 194b protruding from a central portion of the body 194a, and second protrusions 194c protruding from at least one of opposite end portions of the body 194a.

In an embodiment, the body 194a may be formed in a shape corresponding to the vent hole 143. For example, the body 194a may be formed in a substantially cylindrical shape. The body 194a may be formed to be smaller than the vent hole 143 so as to be inserted into the vent hole 143. In various embodiments, the body 194a may be formed such that the diameter of the central portion is greater than the diameters of the opposite end portions. However, the shape of the body 194a is not limited to the illustrated embodiment and may be changed to various shapes.

In an embodiment, the first protrusions 194b may be formed along the outer circumferential surface of the central portion of the body 194a. For example, the first protrusions 194b may protrude from the outer circumferential surface of the body 194a. For example, a plurality of first protrusions 194b may be formed. When the pin 194 is inserted into the vent hole 143, the first protrusions 194b may be brought into close contact with the inside surface of the vent hole 143, and thus the size of the opening area of the vent hole 143 may be decreased. For example, when the opening area of the vent hole 143 is decreased, a space in which fluid moves may be decreased, and thus the amount of fluid introduced may be reduced.

In an embodiment, the second protrusions 194b may protrude from the opposite end portions of the body 194a. Although the second protrusions 194c protrude from the opposite end portions of the body 194a according to the illustrated embodiment, this is illustrative, and the second protrusions 194c may be formed on at least one of the opposite end portions of the body 194a. When the pin 194 is inserted into the vent hole 143, the second protrusions 194c may be stopped by the inside of the vent hole 143, and thus the pin 194 may be fastened so as not to be separated from the vent hole 143.

In an embodiment, the pin 194 may be formed to be symmetric with respect to the central portion of the body 194a. For example, the pin 194 may be formed to be bilaterally symmetric and thus may be fastened without a limitation in an insertion direction when inserted into the vent hole 143.

The pin 194 illustrated in FIG. 18 is illustrative, and the shape of the pin 194 is not limited to the illustrated embodiment. The pin 194 may function to reduce the opening area by partially closing the vent hole 143 and may be changed to various shapes within such a range as to provide the function.

Figure 19:
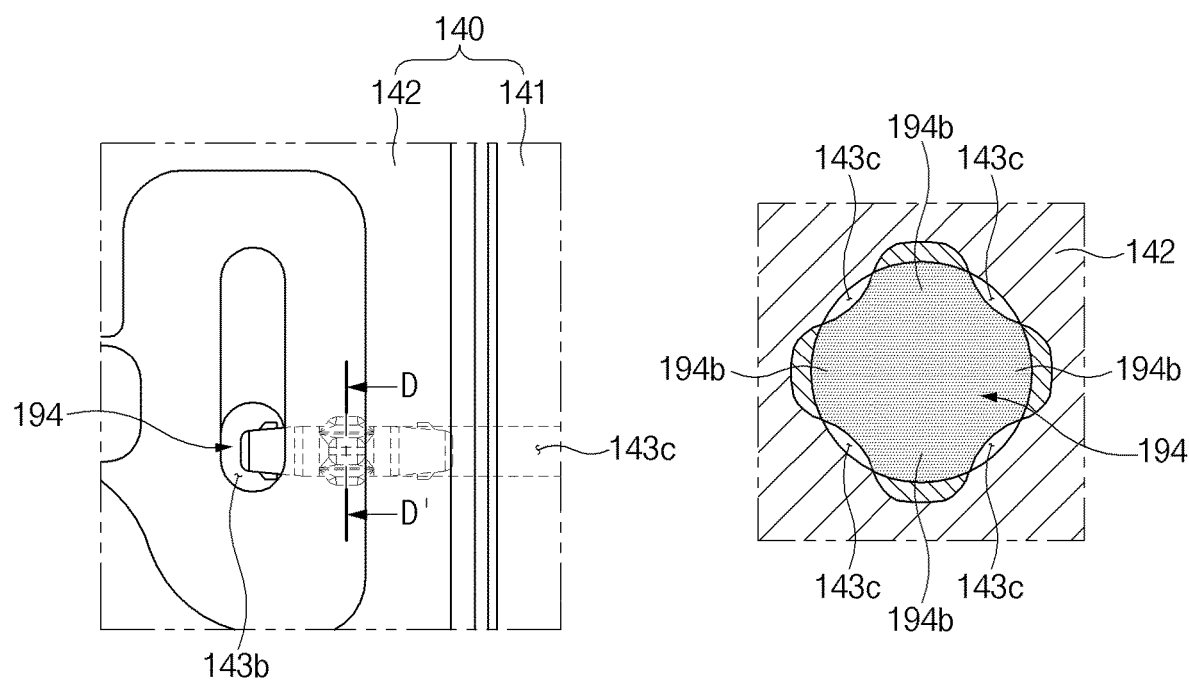
FIG. 19 illustrates a coupling structure of a side member and a pin of an electronic device according to an embodiment of the disclosure.

FIG. 19 illustrates a coupling structure of a side member and a pin of an electronic device according to an embodiment of the disclosure.

Figure 20:
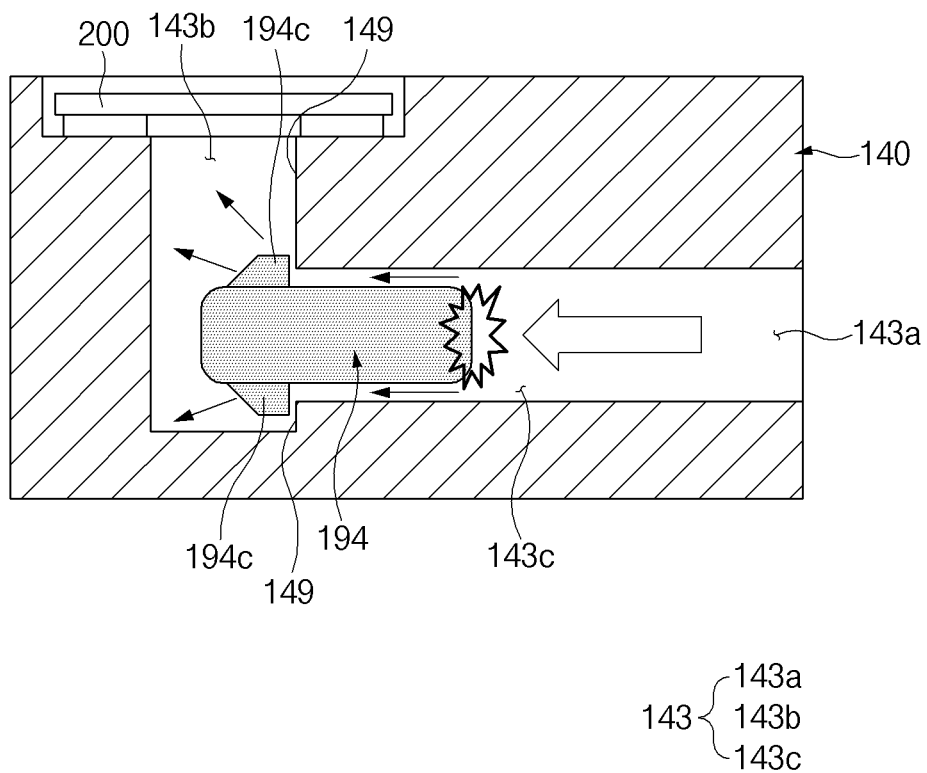
FIG. 20 illustrates a coupling structure of a side member and a pin of an electronic device according to an embodiment of the disclosure.

FIG. 20 illustrates the coupling structure of a side member and a pin of an electronic device according to an embodiment of the disclosure.

Referring to FIGS. 19 and 20, the electronic device 100 according to an embodiment may include the side member 140 including the vent hole 143, the waterproof structure 200 attached to the side member 140, and the pin 194 inserted into at least a portion of the vent hole 143.

In an embodiment, the pin 194 may be inserted into the vent hole 143. For example, the pin 194 may be inserted into the duct 143c of the vent hole 143. The pin 194 inserted into the duct 143c may close at least a portion of the duct 143c.

In an embodiment, the pin 194 may be inserted into the duct 143c, and at least a portion of the pin 194 may be brought into close contact with the inside surface of the duct 143c. For example, the first protrusions 194b of the pin 194 may make contact with the inside surface of the duct 143c. In various embodiments, the first protrusions 194b may be inserted into the duct 143c while overlapping the inside surface of the duct 143c. For example, the diameter of a virtual circle connecting the outside edges of the first protrusions 194b may be greater than the diameter of the duct 143c.

In various embodiments, the first protrusions 194b may partially contain a flexible material or an elastic material so as to deform while being brought into close contact with the inner wall of the duct 143c as the pin 194 is inserted into the duct 143c.

In an embodiment, the size of the opening area of the duct 143c may be decreased when the pin 194 is inserted into the duct 143c. For example, when the cross-section of the pin 194 and the duct 143c in one direction is viewed, the pin 194 may close at least a portion of the entire area of the duct 143c, and the remaining partial areas may be open through between the first protrusions 194b.

In an embodiment, fluid introduced through the first opening area 143a may pass through the opening area of the duct 143c and may move to the second opening area 143b.

For example, the pin 194 may decrease the area of a passage through which the fluid moves. In various embodiments, when liquid outside the electronic device 100 is introduced into the vent hole 143, a flow of the liquid passing through the first opening area 143*a* toward the second opening area 143*b* may be restricted by the pin 194 in a predetermined range. Accordingly, the amount of liquid delivered to the waterproof structure 200 may be decreased, and the pressure of the liquid transmitted to the waterproof structure 200 may be reduced.

In an embodiment, the pin 194 may be configured such that the second protrusions 194*c* are stopped by an inside wall 149 of the vent hole 143 when the pin 194 is inserted into the vent hole 143. For example, the second protrusions 194*c* may be stopped by the inside wall 149 of the side member 140 that surrounds the duct 143*c*. Accordingly, the pin 194 may be prevented from being separated from the vent hole 143.

FIG. 21 is a block diagram illustrating an electronic device in a network environment according to an embodiment of the disclosure.

Referring to FIG. 21, the electronic device 401 in the network environment 400 may communicate with an electronic device 402 via a first network 498 (e.g., a short-range wireless communication network), or at least one of an electronic device 404 or a server 408 via a second network 499 (e.g., a long-range wireless communication network). According to an embodiment, the electronic device 401 may communicate with the electronic device 404 via the server 408. According to an embodiment, the electronic device 401 may include a processor 420, memory 430, an input module 450, a sound output module 455, a display module 460, an audio module 470, a sensor module 476, an interface 477, a connecting terminal 478, a haptic module 479, a camera module 480, a power management module 488, a battery 489, a communication module 490, a subscriber identification module (SIM) 496, or an antenna module 497. In some embodiments, at least one of the components (e.g., the connecting terminal 478) may be omitted from the electronic device 401, or one or more other components may be added in the electronic device 401. In some embodiments, some of the components (e.g., the sensor module 476, the camera module 480, or the antenna module 497) may be implemented as a single component (e.g., the display module 460).

The processor 420 may execute, for example, software (e.g., a program 440) to control at least one other component (e.g., a hardware or software component) of the electronic device 401 coupled with the processor 420, and may perform various data processing or computation. According to one embodiment, as at least part of the data processing or computation, the processor 420 may store a command or data received from another component (e.g., the sensor module 476 or the communication module 490) in volatile memory 432, process the command or the data stored in the volatile memory 432, and store resulting data in non-volatile memory 434. According to an embodiment, the processor 420 may include a main processor 421 (e.g., a central processing unit (CPU) or an application processor (AP)), or an auxiliary processor 423 (e.g., a graphics processing unit (GPU), a neural processing unit (NPU), an image signal processor (ISP), a sensor hub processor, or a communication processor (CP)) that is operable independently from, or in conjunction with, the main processor 421. For example, when the electronic device 401 includes the main processor 421 and the auxiliary processor 423, the auxiliary processor 423 may be adapted to consume less power than the main processor 421, or to be specific to a specified function. The auxiliary processor 423 may be implemented as separate from, or as part of the main processor 421.

The auxiliary processor 423 may control at least some of functions or states related to at least one component (e.g., the display module 460, the sensor module 476, or the communication module 490) among the components of the electronic device 401, instead of the main processor 421 while the main processor 421 is in an inactive (e.g., sleep) state, or together with the main processor 421 while the main processor 421 is in an active state (e.g., executing an application). According to an embodiment, the auxiliary processor 423 (e.g., an image signal processor or a communication processor) may be implemented as part of another component (e.g., the camera module 480 or the communication module 490) functionally related to the auxiliary processor 423. According to an embodiment, the auxiliary processor 423 (e.g., the neural processing unit) may include a hardware structure specified for artificial intelligence model processing. An artificial intelligence model may be generated by machine learning. Such learning may be performed, e.g., by the electronic device 401 where the artificial intelligence is performed or via a separate server (e.g., the server 408). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 430 may store various data used by at least one component (e.g., the processor 420 or the sensor module 476) of the electronic device 401. The various data may include, for example, software (e.g., the program 440) and input data or output data for a command related thereto. The memory 430 may include the volatile memory 432 or the non-volatile memory 434.

The program 440 may be stored in the memory 430 as software, and may include, for example, an operating system (OS) 442, middleware 444, or an application 446.

The input module 450 may receive a command or data to be used by another component (e.g., the processor 420) of the electronic device 401, from the outside (e.g., a user) of the electronic device 401. The input module 450 may include, for example, a microphone, a mouse, a keyboard, a key (e.g., a button), or a digital pen (e.g., a stylus pen).

The sound output module 455 may output sound signals to the outside of the electronic device 401. The sound output module 455 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 460 may visually provide information to the outside (e.g., a user) of the electronic device 401. The display module 460 may include, for example, a display, a hologram device, or a projector and control circuitry to control a corresponding one of the display, hologram device, and projector. According to an embodiment, the display module 460 may include a touch sensor adapted to detect a touch, or a pressure sensor adapted to measure the intensity of force incurred by the touch.

The audio module 470 may convert a sound into an electrical signal and vice versa. According to an embodiment, the audio module 470 may obtain the sound via the input module 450, or output the sound via the sound output module 455 or a headphone of an external electronic device (e.g., an electronic device 402) directly (e.g., wiredly) or wirelessly coupled with the electronic device 401.

The sensor module 476 may detect an operational state (e.g., power or temperature) of the electronic device 401 or an environmental state (e.g., a state of a user) external to the electronic device 401, and then generate an electrical signal or data value corresponding to the detected state. According to an embodiment, the sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 477 may support one or more specified protocols to be used for the electronic device 401 to be coupled with the external electronic device (e.g., the electronic device 402) directly (e.g., wiredly) or wirelessly. According to an embodiment, the interface 477 may include, for example, a high definition multimedia interface (HDMI), a universal serial bus (USB) interface, a secure digital (SD) card interface, or an audio interface.

A connecting terminal 478 may include a connector via which the electronic device 401 may be physically connected with the external electronic device (e.g., the electronic device 402). According to an embodiment, the connecting terminal 478 may include, for example, a HDMI connector, a USB connector, a SD card connector, or an audio connector (e.g., a headphone connector).

The haptic module 479 may convert an electrical signal into a mechanical stimulus (e.g., a vibration or a movement) or electrical stimulus which may be recognized by a user via his tactile sensation or kinesthetic sensation. According to an embodiment, the haptic module 479 may include, for example, a motor, a piezoelectric element, or an electric stimulator.

The camera module 480 may capture a still image or moving images. According to an embodiment, the camera module 480 may include one or more lenses, image sensors, image signal processors, or flashes.

The power management module 488 may manage power supplied to the electronic device 401. According to one embodiment, the power management module 488 may be implemented as at least part of, for example, a power management integrated circuit (PMIC).

The battery 489 may supply power to at least one component of the electronic device 401. According to an embodiment, the battery 489 may include, for example, a primary cell which is not rechargeable, a secondary cell which is rechargeable, or a fuel cell.

The communication module 490 may support establishing a direct (e.g., wired) communication channel or a wireless communication channel between the electronic device 401 and the external electronic device (e.g., the electronic device 402, the electronic device 404, or the server 408) and performing communication via the established communication channel. The communication module 490 may include one or more communication processors that are operable independently from the processor 420 (e.g., the application processor (AP)) and supports a direct (e.g., wired) communication or a wireless communication. According to an embodiment, the communication module 490 may include a wireless communication module 492 (e.g., a cellular communication module, a short-range wireless communication module, or a global navigation satellite system (GNSS) communication module) or a wired communication module 494 (e.g., a local area network (LAN) communication module or a power line communication (PLC) module). A corresponding one of these communication modules may communicate with the external electronic device via the first network 498 (e.g., a short-range communication network, such as Bluetooth™, wireless-fidelity (Wi-Fi) direct, or infrared data association (IrDA)) or the second network 499 (e.g., a long-range communication network, such as a legacy cellular network, a 5G network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 492 may identify and authenticate the electronic device 401 in a communication network, such as the first network 498 or the second network 499, using subscriber information (e.g., international mobile subscriber identity (IMSI)) stored in the subscriber identification module 496.

The wireless communication module 492 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 492 may support a high-frequency band (e.g., the mmWave band) to achieve, e.g., a high data transmission rate. The wireless communication module 492 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 492 may support various requirements specified in the electronic device 401, an external electronic device (e.g., the electronic device 404), or a network system (e.g., the second network 499). According to an embodiment, the wireless communication module 492 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 497 may transmit or receive a signal or power to or from the outside (e.g., the external electronic device) of the electronic device 401. According to an embodiment, the antenna module 497 may include an antenna including a radiating element composed of a conductive material or a conductive pattern formed in or on a substrate (e.g., a printed circuit board (PCB)). According to an embodiment, the antenna module 497 may include a plurality of antennas (e.g., array antennas). In such a case, at least one antenna appropriate for a communication scheme used in the communication network, such as the first network 498 or the second network 499, may be selected, for example, by the communication module 490 (e.g., the wireless communication module 492) from the plurality of antennas. The signal or the power may then be transmitted or received between the communication module 490 and the external electronic device via the selected at least one antenna. According to an embodiment, another component (e.g., a radio frequency integrated circuit (RFIC)) other than the radiating element may be additionally formed as part of the antenna module 497.

According to various embodiments, the antenna module 497 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 401 and the external electronic device 404 via the server 408 coupled with the second network 499. Each of the electronic devices 402 or 404 may be a device of a same type as, or a different type, from the electronic device 401. According to an embodiment, all or some of operations to be executed at the electronic device 401 may be executed at one or more of the external electronic devices 402, 404, or 408. For example, if the electronic device 401 should perform a function or a service automatically, or in response to a request from a user or another device, the electronic device 401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 401. The electronic device 401 may provide the outcome, with or without further processing of the outcome, as at least part of a reply to the request. To that end, a cloud computing, distributed computing, mobile edge computing (MEC), or client-server computing technology may be used, for example. The electronic device 401 may provide ultra low-latency services using, e.g., distributed computing or mobile edge computing. In another embodiment, the external electronic device 404 may include an internet-of-things (IoT) device. The server 408 may be an intelligent server using machine learning and/or a neural network. According to an embodiment, the external electronic device 404 or the server 408 may be included in the second network 499. The electronic device 401 may be applied to intelligent services (e.g., smart home, smart city, smart car, or healthcare) based on 5G communication technology or IoT-related technology.

An electronic device 100 according to an embodiment of the disclosure may include a front plate 120, a back plate 180 that faces the front plate 120, a side member 140 that surrounds an inner space S between the front plate 120 and the back plate 180 and that includes a frame 141 that forms a side surface of the electronic device 100 and a plate 142 that extends from the frame 141 toward the inner space S, and a blocking member 200 located in the inner space S and disposed on the plate 142 to cover a partial area of the plate 142 connected with the outside of the electronic device 100. The blocking member 200 may include a membrane 210 including a first surface 211 and a second surface 212 that faces away from the first surface 211 and a cover member 220 that is disposed between the second surface 212 of the membrane 210 and the plate 142 and that has a through-hole 223 formed in at least a portion thereof. The through-hole 223 may fluidly communicate with the outside of the electronic device 100 through the partial area of the plate 142.

In various embodiments, the side member 140 may have a vent hole 143 formed in at least a portion thereof to fluidly communicate with the through-hole 223, and the vent hole 143 may penetrate at least a portion of the frame 141 and at least a portion of the plate 142.

In various embodiments, the cover member 220 may include a third surface 221 that faces the second surface 212 of the membrane 210 and a fourth surface 222 that faces away from the third surface 221 and that is attached to the plate 142, and a partial area of the vent hole 143 that penetrates through the plate 142 may be visually hidden by the cover member 220 when the third surface 221 of the cover member 220 is viewed from above.

In various embodiments, the vent hole 143 may include a first opening area 143a formed in a portion of the frame 141, a second opening area 143b formed in a portion of the plate 142, and a duct 143c extending to connect the first opening area 143a and the second opening area 143b.

In various embodiments, the blocking member 200 may be attached to the plate 142 to overlap the second opening area 143b and may include a waterproof material in at least a portion thereof.

In various embodiments, the blocking member 200 may further include a first adhesive member 230 that is disposed between the second surface 212 of the membrane 210 and the cover member 220 and that has a first opening 231 formed therein and a second adhesive member 240 that is disposed between the cover member 220 and the plate 142 and that has a second opening 241 formed therein. The through-hole 223 of the cover member 220 may be configured to fluidly communicate with the vent hole 143 through the second opening 241.

In various embodiments, when the cover member 220 is viewed from above, the through-hole 223 may overlap a partial area of the second opening 241, and the second opening area 143b may overlap another area of the second opening 241.

In various embodiments, the second surface 212 of the membrane 210 may face at least a portion of the cover member 220 through the first opening 231.

In various embodiments, the plate 142 may include a bonding area 144 to which the blocking member 200 is attached, and at least a portion of the plate 142 may be recessed to form the bonding area 144.

In various embodiments, the plate 142 may include a recess 145 connected with at least a portion of the vent hole 143 and formed in the bonding area 144, and at least a portion of the bonding area 144 may be recessed to form the recess 145.

In various embodiments, the vent hole 143 may have a shape in which at least a portion extends to be inclined toward the back plate 180 with an approach to the inner space S.

In various embodiments, the electronic device 100 may further include a layer structure 300 disposed between the blocking member 200 and the plate 142, and the layer structure 300 may be configured to form a flow passage along which fluid moves between the vent hole 143 and the through-hole 223.

In various embodiments, the layer structure 300 may include a third adhesive member 330 having a third opening 331 formed therein, a first sheet 310 that is attached to one surface of the third adhesive member 330 and that has a first hole 311 formed therein to be aligned with a partial area of the third opening 331, a second sheet 320 that is attached to an opposite surface of the third adhesive member 330 and that has a second hole 321 formed therein to be aligned with another area of the third opening 331, and a fourth adhesive member 340 that is disposed between the first sheet 310 and the plate 142 and that has a fourth opening 341 formed therein to fluidly communicate with the first hole 311 and the vent hole 143.

In various embodiments, when the first sheet 310 is viewed from above, the first hole 311 may overlap a partial area of the fourth opening 341, and at least a portion of the vent hole 143 may overlap another area of the fourth opening 341.

In various embodiments, the cover member 220 may be attached to the membrane 210 so as to be spaced apart from the second surface 212 of the membrane 210.

In various embodiments, the cover member 220 may be configured such that at least a portion thereof is brought into contact with the membrane 210 by pressure P of liquid introduced from outside the electronic device 100.

In various embodiments, the membrane 210 may be formed of a waterproof and air-permeable material, and the cover member 220 may be formed of a waterproof and non-breathable material.

In various embodiments, the blocking member 200 may be configured to allow equalization of air pressure between the inner space S of the electronic device 100 and an outside of the electronic device 100, and the blocking member 220 may be further configured to prevent liquid from outside the electronic device 100 from entering the inner space S of the electronic device 100.

In various embodiments, a pressure directly applied or transmitted to the membrane 210 by a liquid introduced from outside the electronic device 100 and moving through the through-hole 223 of the cover member 220 may be thereby reduced.

A blocking member 200 according to an embodiment of the disclosure may include a membrane 210 including a first surface 211 and a second surface 212 that faces away from the first surface 211, a cover member 220 that is attached to the second surface 212 of the membrane 210 and that has a through-hole 223 formed in at least a portion thereof, the cover member 220 including a third surface 221 that faces the second surface 212 and a fourth surface 222 that faces away from the third surface 221, and a first adhesive member 230 that is disposed between the second surface 212 and the third surface 221 and that attaches the membrane 210 and the cover member 220 to each other, the first adhesive member 230 having a first opening 231, at least a portion of which overlaps the through-hole 223. The membrane 210 may be formed of an air-permeable material, and the cover member 220 may be formed of a non-breathable material.

In various embodiments, the blocking member 200 may include a waterproof material in at least a portion thereof. The first adhesive member 230 may include a peripheral portion that surrounds the first opening 231. The peripheral portion may include a first edge E1 and a second edge E2 that face each other. The through-hole 223 may be located relatively close to one of the first edge E1 and the second edge E2 when the blocking member 200 is viewed from above.

In various embodiments, the blocking member 200 may further include a second adhesive member 240 that is disposed on the fourth surface 222 and that has a second opening 241, at least a portion of which overlaps the through-hole 223. The first adhesive member 230 and the second adhesive member 240 may be formed in substantially the same shape. The through-hole 223 may fluidly communicate with the first opening 231 and the second opening 241 and may be formed to be smaller than the first opening 231 and the second opening 241.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 440) including one or more instructions that are stored in a storage medium (e.g., internal memory 436 or external memory 438) that is readable by a machine (e.g., the electronic device 401). For example, a processor (e.g., the processor 420) of the machine (e.g., the electronic device 401) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:
1. An electronic device comprising:
a front plate;
a back plate configured to face the front plate;
a side member configured to surround an inner space between the front plate and the back plate, the side member including a frame configured to form a side surface of the electronic device and a plate extending from the frame toward the inner space; and
a blocking member located in the inner space and disposed on the plate to cover a partial area of the plate connected with an outside of the electronic device, wherein the blocking member comprises:
a membrane including a first surface and a second surface configured to face away from the first surface,
a cover member disposed between the second surface of the membrane and the plate, the cover member having a through-hole formed in at least a portion thereof, and
a first adhesive member disposed between the second surface of the membrane and the cover member, the first adhesive member having a first opening formed therein to fluidly communicate with the through-hole, and
wherein the through-hole fluidly communicates with the outside of the electronic device through the partial area of the plate.
2. The electronic device of claim 1,
wherein the side member has a vent hole formed in at least a portion thereof to fluidly communicate with the through-hole, and
wherein the vent hole penetrates at least a portion of the frame and at least a portion of the plate.
3. The electronic device of claim 2,
wherein the cover member comprises a third surface configured to face the second surface of the membrane and a fourth surface configured to face away from the third surface and attached to the plate, and
wherein a partial area of the vent hole that penetrates through the plate is visually hidden by the cover member when the third surface of the cover member is viewed from above.
4. The electronic device of claim 2, wherein the vent hole comprises:
a first opening area formed in a portion of the frame;
a second opening area formed in a portion of the plate; and
a duct extending to connect the first opening area and the second opening area.
5. The electronic device of claim 4, wherein the blocking member is attached to the plate to overlap the second opening area and comprises a waterproof material in at least a portion thereof.
6. The electronic device of claim 4,
wherein the blocking member further comprises:
a second adhesive member disposed between the cover member and the plate, the second adhesive member having a second opening formed therein, and
wherein the through-hole of the cover member is configured to fluidly communicate with the vent hole through the second opening.
7. The electronic device of claim 6, wherein when the cover member is viewed from above, the through-hole overlaps a partial area of the second opening, and the second opening area overlaps another area of the second opening.
8. The electronic device of claim 6, wherein the second surface of the membrane faces at least a portion of the cover member through the first opening.
9. The electronic device of claim 2,
wherein the plate comprises a bonding area to which the blocking member is attached, and
wherein at least a portion of the plate is recessed to form the bonding area.
10. The electronic device of claim 9,
wherein the plate comprises a recess connected with at least a portion of the vent hole and formed in the bonding area, and
wherein at least a portion of the bonding area is recessed to form the recess.
11. The electronic device of claim 2, wherein the vent hole has a shape in which at least a portion extends to be inclined toward the back plate with an approach to the inner space.

12. The electronic device of claim 2, further comprising:
a layer structure disposed between the blocking member and the plate,
wherein the layer structure is configured to form a flow passage along which fluid moves between the vent hole and the through-hole.

13. The electronic device of claim 12, wherein the layer structure comprises:
a third adhesive member having a third opening formed therein;
a first sheet attached to one surface of the third adhesive member, the first sheet having a first hole formed therein to be aligned with a partial area of the third opening;
a second sheet attached to an opposite surface of the third adhesive member, the second sheet having a second hole formed therein to be aligned with another area of the third opening; and
a fourth adhesive member disposed between the first sheet and the plate, the fourth adhesive member having a fourth opening formed therein to fluidly communicate with the first hole and the vent hole.

14. The electronic device of claim 13, wherein when the first sheet is viewed from above, the first hole overlaps a partial area of the fourth opening, and at least a portion of the vent hole overlaps another area of the fourth opening.

15. The electronic device of claim 1, wherein the cover member is attached to the membrane so as to be spaced apart from the second surface of the membrane, and
wherein the cover member is configured such that at least a portion thereof is brought into contact with the membrane by pressure of liquid introduced from outside the electronic device.

16. The electronic device of claim 15, wherein a pressure directly applied or transmitted to the membrane by a liquid introduced from outside the electronic device and moving through the through-hole of the cover member is thereby reduced.

17. The electronic device of claim 1,
wherein the membrane is formed of a waterproof and air-permeable material, and
wherein the cover member is formed of a waterproof and non-breathable material.

* * * * *